(12) United States Patent
Abe et al.

(10) Patent No.: US 6,943,383 B2
(45) Date of Patent: Sep. 13, 2005

(54) DIODE AND PRODUCING METHOD THEREOF

(75) Inventors: Ruichiro Abe, Ichinomiya (JP); Kenji Kouno, Gifu (JP)

(73) Assignee: Denso Corporation, Kariya (JP)

(*) Notice: Subject to any disclaimer, the term of this patent is extended or adjusted under 35 U.S.C. 154(b) by 0 days.

(21) Appl. No.: 10/627,729

(22) Filed: Jul. 28, 2003

(65) Prior Publication Data

US 2004/0016971 A1 Jan. 29, 2004

(30) Foreign Application Priority Data

Sep. 27, 2002 (JP) ........................................ 2002-284144

(51) Int. Cl.$^7$ ........................ H01L 29/74; H01L 31/111
(52) U.S. Cl. ........................ 257/173; 257/355; 257/653; 257/654
(58) Field of Search ........................ 257/173, 355, 257/653, 654

(56) References Cited

U.S. PATENT DOCUMENTS 6,518,604 B1    2/2003    Worley et al.

FOREIGN PATENT DOCUMENTS

EP        0345432       12/1989

OTHER PUBLICATIONS

Kenji Kono, ESD surge simulation of IC for automobile, Technical Report of IEICE, SDM2002–184, vol. 102, No. 347, Oct. 1, 2002, pp31–36.

Primary Examiner—Long Pham
(74) Attorney, Agent, or Firm—Posz Law Group, PLC

(57) ABSTRACT

A PN junction diode has a substrate 1 of a first conductivity type, and first and second stripe diffusion regions 2, 3 which are the first conductivity type and second conductivity type, respectively. The stripe diffusion regions are alternately arranged at a regular interval in a surface layer of the semiconductor substrate. The diode further includes first and second stripe electrodes 7a, 7b connected to the first and second diffusion regions along the longitudinal sides thereof, respectively. The diode further includes a third electrode 7b' which covers through an insulation film 5, 5' the neighboring ends of the first and second diffusion regions and of which a potential is equalized to that of the second electrode 7b having a different conductivity type from the substrate.

6 Claims, 21 Drawing Sheets $L_{1a} = L_{1b}$
$L_x = L_y$
$L_{ea} = L_{eb}$ $L_1 = L_2 = L_3 = L_4 = L_5 = L_6 = L_7 = L_8$     $L_P \neq L_N$ $L_1 = L_2 = L_3 = L_4 = L_5 = L_6 = L_7 = L_8$ $L_1 = L_2 = L_3 = L_4 = L_5 = L_6 = L_7 = L_8 \quad L_P \neq L_N$

US 6,943,383 B2

DIODE AND PRODUCING METHOD THEREOF

CROSS REFERENCE TO RELATED APPLICATION

This application is related to and incorporates herein by reference Japanese Patent Applications No. 2002-20135 filed on Jan. 29, 2002 and No. 2002-284144 filed on Sep. 27, 2002.

FIELD OF THE INVENTION

This invention relates to a diode and particularly to a PN junction diode including stripe diffusion layers for input/output protection in an integrated circuit.

BACKGROUND OF THE INVENTION

PN junction diodes have been used as a protection element for preventing semiconductor devices from being destroyed due to electrostatic discharge (ESD), a surge voltage, or a surge current. Such a PN junction diode for input/output protection is disclosed in Japanese patent application provisional publication No. 02-58262.

FIG. 22A is a plan view of a related art typical PN junction diode for input/output protection. FIG. 22B is an enlarged cross-sectional view taken along line XXIIB—XXIIB in FIG. 22A.

The PN junction diode 100 shown in FIGS. 22A and 22B includes an N-type low impurity concentration silicon semiconductor substrate (n–)1, a P-type high impurity concentration diffusion region 2 as a base in the surface portion of the substrate 1, and N-type high impurity concentration diffusion regions 3a and 3b as an emitter on both sides of the base in the surface layer of the substrate 1 to provide PN junction. In FIG. 22A, the P-type high impurity concentration diffusion region 2 and the N-type high impurity concentration diffusion regions 3a and 3b are denoted with broken lines.

As shown in FIG. 22B, the P-type high impurity diffusion region 2 and the N-type high impurity diffusion regions 3a and 3b are connected to Al electrodes 7a and 7b through openings in an insulation film 5 comprising BPSG (borophosphosilicate glass), respectively. More specifically, as shown in the plan view of FIG. 22A, the P-type high impurity concentration diffusion region 2 is connected to the Al electrode 7a as a base electrode, and the N-type high impurity concentration diffusion regions 3a and 3b are connected together with the Al electrode 7b as an emitter electrode. Here, in the plan view of FIG. 22A, the Al electrodes 7a and 7b are denoted with solid lines, and the contact regions 71, 72, and 73 are denoted with dotted lines. Further, the whole of the PN junction diode is covered with a protection film 10 comprising silicon nitride (SiN) and is connected to the external through pads 70a and 70b denoted with solid lines in FIG. 22A. Each of the high impurity concentration regions 2, 3a, and 3b has a rectangular shape having dimensions of about 10 ìm×500 ìm. The PN junction diode for input/output protection element for a semiconductor device has tens of PN junction diodes in FIGS. 22A and 22B connected in parallel to protect the circuits in the semiconductor device from a large magnitude of serge current.

Next, a method of producing the PN junction diode shown in FIGS. 22A and 22B will be described with reference to FIGS. 23A to 23E. FIGS. 23A to 23E are enlarged cross-sectional views taken along line XXIIB—XXIIB in FIG. 22A in order of production processes.

As shown in FIG. 23A, on an N-type low impurity concentration silicon (semiconductor) substrate 1, a first mask 101 corresponding to the base is formed, and then P-type impurity is ion-injected at a relatively high concentration to form the P-type high impurity concentration diffusion region 2 to provide the base.

Subsequently, as shown in FIG. 23B, the first mask 101 corresponding to the base is removed, and then a second mask 102 corresponding to the emitter is formed. Next, N-type impurity is ion-injected at a relatively high concentration to form N-type high impurity concentration diffusion regions 3a and 3b as the emitter on the both sides of the P-type high impurity concentration diffusion region 2. This provides PN junction regions 4a and 4b at the semiconductor portions between the P-type high impurity concentration diffusion region 2 and the N-type high impurity concentration diffusion regions 3a and 3b.

Next, as shown in FIG. 23C, the second mask 102 corresponding to the emitter is removed, and then a BPSG film as an intermediate insulation film 5 is deposited on a entire surface of the substrate 1. Openings 61, 62 and 63 are formed to obtain connections with the P-type high impurity concentration diffusion region 2 and N-type high impurity concentration diffusion regions 3a and 3b, respectively.

After that, as shown in FIG. 23D, Al is deposited on the entire current top surface to have an Al film, which is patterned to have a base electrode 7a and emitter electrodes 7b.

Now, as shown in FIG. 23E, SiN is deposited on the entire top surface to have a protection film 10, and then openings for pads are formed for external connection to complete the PN junction diode 100 shown in FIGS. 22A and 22B When a surge such as ESD is applied to the N-type high diffusion regions 3a and 3b as the emitter, immediately, the PN junction regions 4a and 4b are reversely biased. This generates an avalanche conduction, so that a surge current flows from the N-type high impurity concentration diffusion regions 3a and 3b to the P-type high impurity concentration diffusion region 2. The PN junction regions 4a and 4b have widths $L_{ca}$ and $L_{cb}$, respectively, which are equal to each other in designing step. However, in the manufacturing step, the widths $L_{ca}$ and $L_{cb}$ may become different from each other (in the figure, $L_{ca} < L_{cb}$). In FIG. 22B, as shown by the arrows having different thicknesses, a surge current flowing through the PN junction region 4a having a smaller width is greater in magnitude than the surge current flowing through the PN junction region 4b. Thus, the diode having deviation in a magnitude of a surge current due to the different widths $L_{ca}$ and $L_{cb}$, has a relatively low withstanding voltage against a surge voltage, thus, being easily destroyed.

Moreover, particularly, the P-type high impurity concentration diffusion region 2 and the N-type high impurity concentration diffusion regions 3a and 3b having rectangular edges may be subjected to destruction due to a surge voltage because electric surge current concentrates thereto.

Therefore, it would be desirable to provide a PN junction diode capable of suppressing the concentration of electric surge current at the ends of the stripe diffusion regions therein.

Further, it would be also desirable to provide a PN junction diode in which the surge currents can be uniformly conducted through each of plural PN junction regions.

SUMMARY OF THE INVENTION

One object of the present invention is to provide a superior diode.

Another object is to provide a diode with an improved ESD withstanding capacity.

A further object of the present invention is to provide a PN junction diode capable of uniformly conducting surge currents through plural PN junction regions thereof.

A still further object of the present invention is to provide a PN junction diode having an insulation layer on the. PN junction region with heat resistivity.

According to a first aspect of the present invention, a PN junction diode is constructed to suppress the concentration of current at the ends of stripe diffusion regions in the PN diode. According to a second aspect of the present invention, a diode includes a substrate of a first conductivity type, and first and second stripe diffusion regions which are the first conductivity type and second conductivity type, respectively. The stripe diffusion regions are alternately arranged at a regular interval in a surface layer of the semiconductor substrate. The longitudinal sides of the first and second stripe diffusion regions are arranged so as to face each other to have a stripe pattern. The diode further includes first and second stripe electrodes above the first and second diffusion regions along the longitudinal sides, connected to the first and second diffusion regions, respectively. The diode further includes surge current concentration suppressing part for suppressing concentration of the surge current at neighboring ends of the first and second stripe diffusion regions.

According to a third aspect of the present invention, a PN junction diode includes stripe diffusion regions for a base region and emitter regions which are equaidistantly arranged with an insulation protection film thereon having openings provided for forming the base region and emitter regions.

According to a fourth aspect of the present invention, a diode includes an insulation layer on the PN junction region with heat resistivity.

BRIEF DESCRIPTION OF THE DRAWINGS

The object and features of the present invention will become more readily apparent from the following detailed description taken in conjunction with the accompanying drawings in which.

DETAILED DESCRIPTION OF THE PREFERRED EMBODIMENT

Figure 1A:
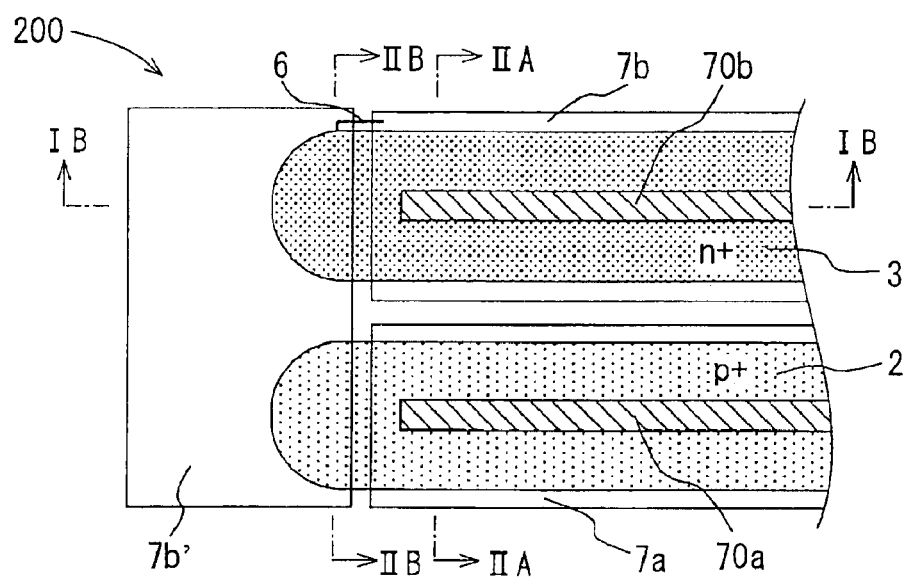
FIG. 1A is a partial plan view of a PN junction diode according to a first embodiment of the present invention.

The present invention will be described in detail with reference to various embodiments.

[First Embodiment]

The PN junction diode 200 includes a P-type (p conductivity type, p-impurity type) silicon semiconductor substrate 1, a P-type high impurity concentration diffusion region 2 in a surface layer of the P-type silicon semiconductor substrate 1, and an N-type high impurity concentration diffusion region 3 in the surface layer, wherein the P-type high impurity concentration diffusion region 2 and the N-type high impurity concentration diffusion region 3 are alternately arranged at a regular interval in a first direction (parallel to line IIA—IIA), and longitudinal sides of the diffusion regions 2 and 3 are arranged in a second direction (parallel to line IB—IB) so as to face each other, thereby forming a stripe pattern.

A predetermined number of pairs of the P-type high impurity concentration diffusion region 2 and the N-type high impurity concentration diffusion region 3 are recurrently arranged in the first direction, wherein the number is determined in accordance with the required withstanding surge current. However, FIG. 1A illustrates only one pair of the P-type high impurity concentration diffusion region 2 and the N-type high impurity concentration diffusion region 3.

Figure 1B:
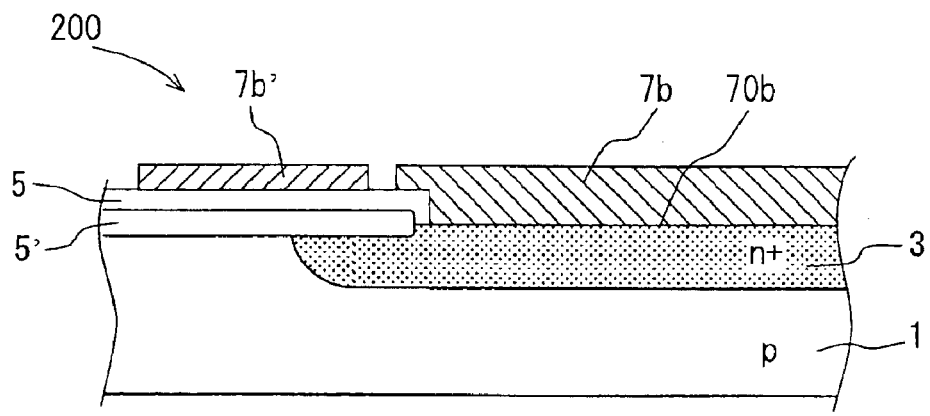
FIG. 1B is a partial cross-sectional view taken along line IB—IB in FIG. 1A.

The P-type high impurity concentration diffusion region 2 corresponds to a base (anode) of the PN junction diode 200, and the N-type high impurity concentration diffusion region 3 corresponds to an emitter (cathode) of the PN junction diode 200. Here, the configurations of the diode 200 in FIGS. 1A and 1B illustrate the condition just after ion injection. The ion-injected substrate 1 is subsequently subjected to thermal treatment, so that ion injected portions are thermally diffused so as to approach each other along the first direction, so that the longitudinal sides of the ion-injected stripe portions overlap with each other to form a PN junction of the P-type high impurity concentration diffusion region 2 and the N-type high impurity concentration diffusion region 3.

On the P-type high impurity concentration diffusion region 2 and the N-type high impurity concentration diffusion region 3, strip electrodes 7a and 7b made of aluminum (Al) are alternately arranged equidistantly. In FIG. 1A, hatched regions 70a and 70b illustrate contacts between the P-type high impurity concentration diffusion region 2 and the electrode 7a and between the N-type high impurity concentration diffusion region 3 and the electrode 7b, respectively. The contacts 70a and 70b are arranged at the middle portions of the P-type high impurity concentration diffusion region 2 and the N-type high impurity concentration diffusion region 3. Further, a second electrode 7b' is disposed through an insulation film including an LOCOS (localized oxidation of silicon) 5' and an intermediate insulation film 5, on the LOCOS (film) 5' so as to cover neighbor ends (first ends) of the N-type high impurity concentration diffusion region 3 and the P-type high impurity concentration diffusion region 2. The second electrode 7b' is made of aluminum (Al) or polysilicon (Si). Here, the second electrode 7b' is electrically connected to the electrode 7b connecting with the N-type high impurity concentration diffusion region 3 by way of, for example a wire 6 to equalize the potential (voltage) of the second electrode 7b' to that of the electrode 7b.

Figure 2A:
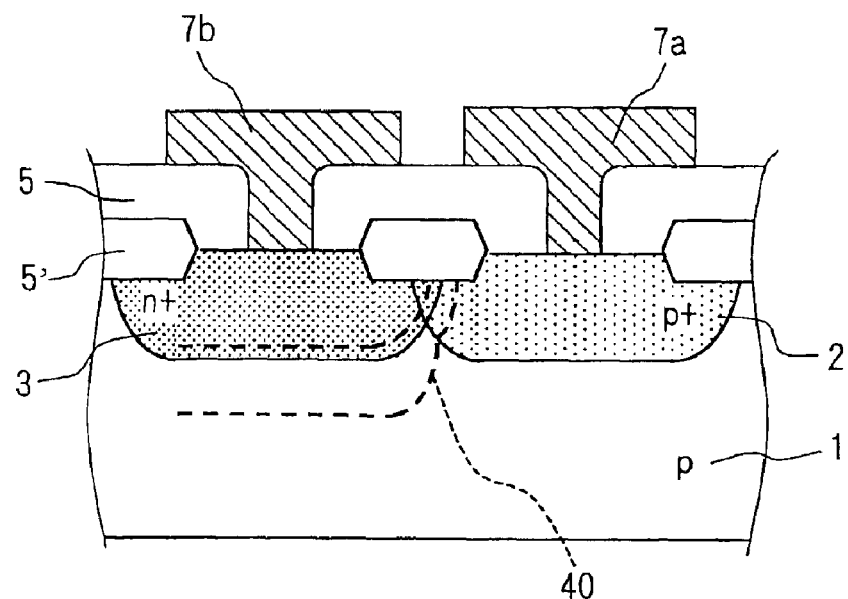
FIG. 2A is a partial cross-sectional view taken along line IIA—IIA in FIG. 1A.
Figure 2B:
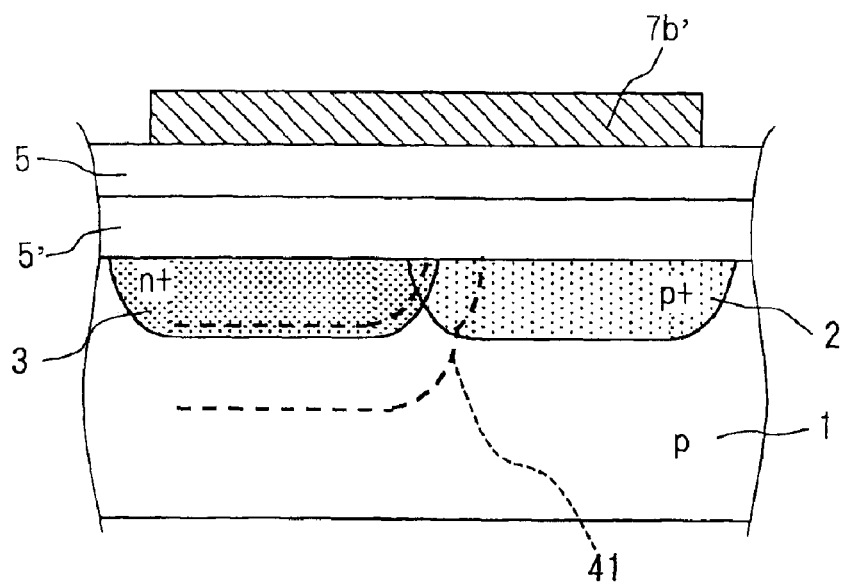
FIG. 2B is a partial cross-sectional view taken along line IIB—IIB in FIG. 1A.

FIGS. 2A and 2B show the condition after thermal diffusion of the P-type high impurity concentration diffusion region 2 and the N-type high impurity concentration diffusion region 3, so that the longitudinal side portions of the stripes of the P-type high impurity concentration diffusion region 2 and the N-type high impurity concentration diffusion region 3 are overlapped with each other. As shown in FIGS. 1A and 1B, the second electrode 7b' is formed to cover the ends of the N-type high impurity concentration diffusion region (emitter) 3 and the P-type high impurity concentration diffusion region (base) 2. Further, the second electrode 7b' is equalized to the electrode (emitter electrode) 7b in potential by wiring. When a positive surge voltage is applied to the emitter (N-type high impurity concentration diffusion region) 3, a positive voltage at the second electrode 7b' causes repulsion of holes in the P-type semiconductor substrate 1 and holes in the P-type high impurity concentration diffusion region 2. This expands a depletion layer 41 (FIG. 2B) at the end of the N-type high impurity concentration diffusion region (emitter) 3 in comparison with the depletion layer 40 (FIG. 2A) at the middle portion. This moderates the concentration of electric current at the end edges, and thus, suppressing the destruction at the end edges due to surge voltages. The opposite ends of the P-type high impurity concentration diffusion region 2 and the N-type high impurity concentration diffusion region 3 may be preferably covered with the second electrode 7b'.

The second electrode 7b' shown in FIGS. 1A and 1B can be modified in various ways. The second electrode 7b' shown in FIG. 1A entirely covers the ends of the P-type high impurity concentration diffusion region 2 and the N-type high impurity concentration diffusion region 3. However, it is sufficient that the second electrode 7b' covers only portions of the ends of the P-type high impurity concentration diffusion region 2 and the N-type high impurity concentration diffusion region 3 around the PN junction interface thereof. The suppression of concentration of electric surge current (electric field) by the second electrode 7b' expanding the depletion layer 41 is most effective at the PN junction interface.

Figure 3A:
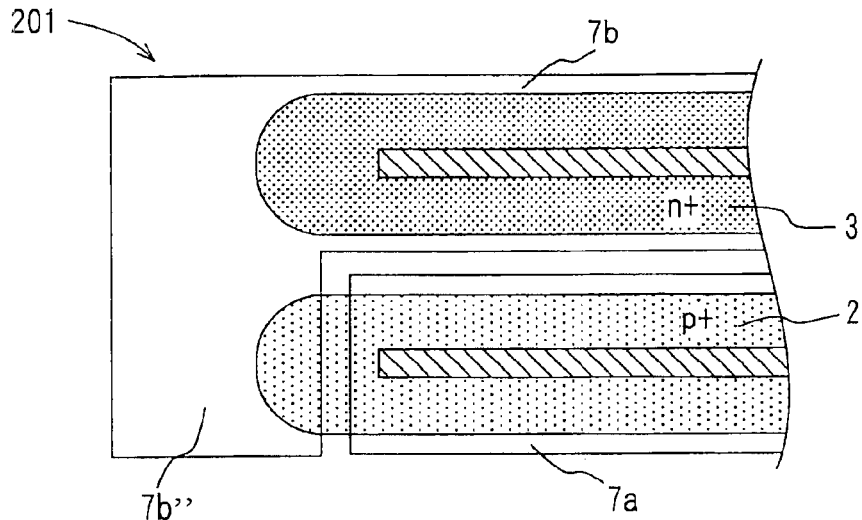
FIG. 3A is a partial plan view of a PN junction diode of an example of modification according to the first embodiment of the present invention.

FIG. 3A shows another modification. In the PN junction diode 201 of FIG. 3A, a second electrode 7b'', corresponding to the second electrode 7b' in FIG. 1A, is integrally formed in one body with the electrode 7b. Thus, wiring which was required in the PN junction diode 200 in FIG. 1A can be omitted, so that the structure is simplified.

Figure 3B:
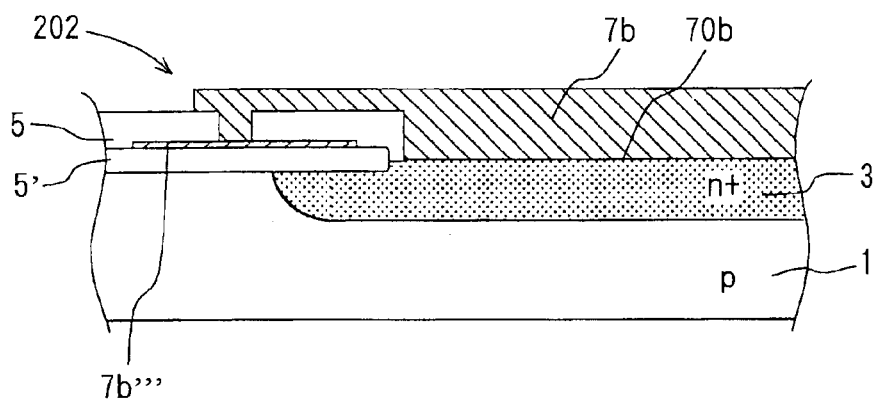
FIG. 3B is a partial cross-sectional view of a PN junction diode of another example of modification according to the first embodiment of the present invention.

FIG. 3B shows the other modification. In the PN junction diode 202 of FIG. 3B, a second electrode 7B''', corresponding to the second electrode 7b' in FIG. 1A, is formed on the LOCOS 5'. The second electrode 7b''' is made of polysilicon and formed together in the forming process of LOCOS and polysilicon used for gate electrodes of MOS transistors when manufacturing an integrated circuit including other semiconductor devices such as MOS transistors. Since the second electrode 7b''' is formed on the LOCOS 5', which is closer to the diffusion regions than the second electrode 7b' in FIG. 1B, suppression of concentration of surge current by the second electrode 7b''' is more effective than the second electrode 7b' in FIG. 1B.

In this embodiment, the LOCOS 5' is formed after ion-injection to form the P-type high impurity concentration diffusion region 2 and the N-type high impurity concentration diffusion region 3.

[Second Embodiment]

In the first embodiment, formation of the second electrode at the ends or corner edges of the diffusion regions prevents from destruction thereat. In the second embodiment, optimizing the forms of the lead wire electrodes for the PN junction diode 210 reduces concentration of surge currents at the ends or corner edges of the diffusion regions.

Figure 4:
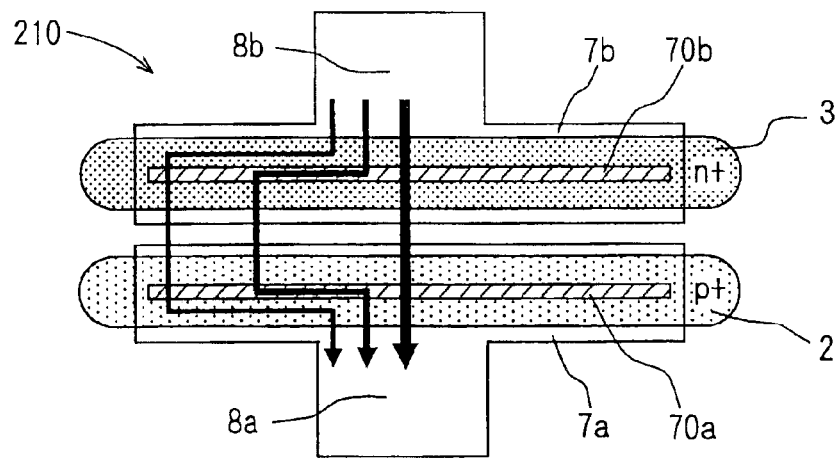
FIG. 4 is a plan view of a PN junction diode according to a second embodiment of the present invention.

FIG. 4 illustrates a plan view of the PN junction diode 210 according to the second embodiment. In the PN junction diode 210, lead wire electrodes 8a and 8b have a width that is smaller than longitudinal side length of the strip electrodes 7a and 7b, and are connected to the electrodes 7a and 7b at the middle portions thereof. In the case of the PN junction diode 210 shown in FIG. 4, the lead wire electrodes 8a and 8b are integrally formed in one body with the strip electrodes 7a and 7b.

This structure makes longer the distances from the lead wire electrodes 8a and 8b to the ends or corner edges of the P-type high impurity concentration diffusion region 2 and the N-type high impurity concentration diffusion region 3 as shown by arrows in FIG. 4, respectively. That is, the resistances of the current paths increase in accordance with distances from the middle portions of the electrodes 7a and 7b, which reduces the ratio of the surge current flowing at the ends of the diffusion regions 2 and 3.

This moderates the concentration of electric current at end edges of the diffusion regions 2 and 3, thereby suppressing destruction at the ends of the diffused regions 2 and 3. Since the lead wire electrodes 8a and 8b are connected to the middle portion of the electrodes 7a and 7b, surge currents flow symmetrically with respect to the centerlines of lead wire electrodes 8a and 8b. Thus, suppression of the surge currents can be provided symmetrically on both sides of the centerline of the lead wire electrodes 8a and 8b.

[Third Embodiment]

Figure 5:
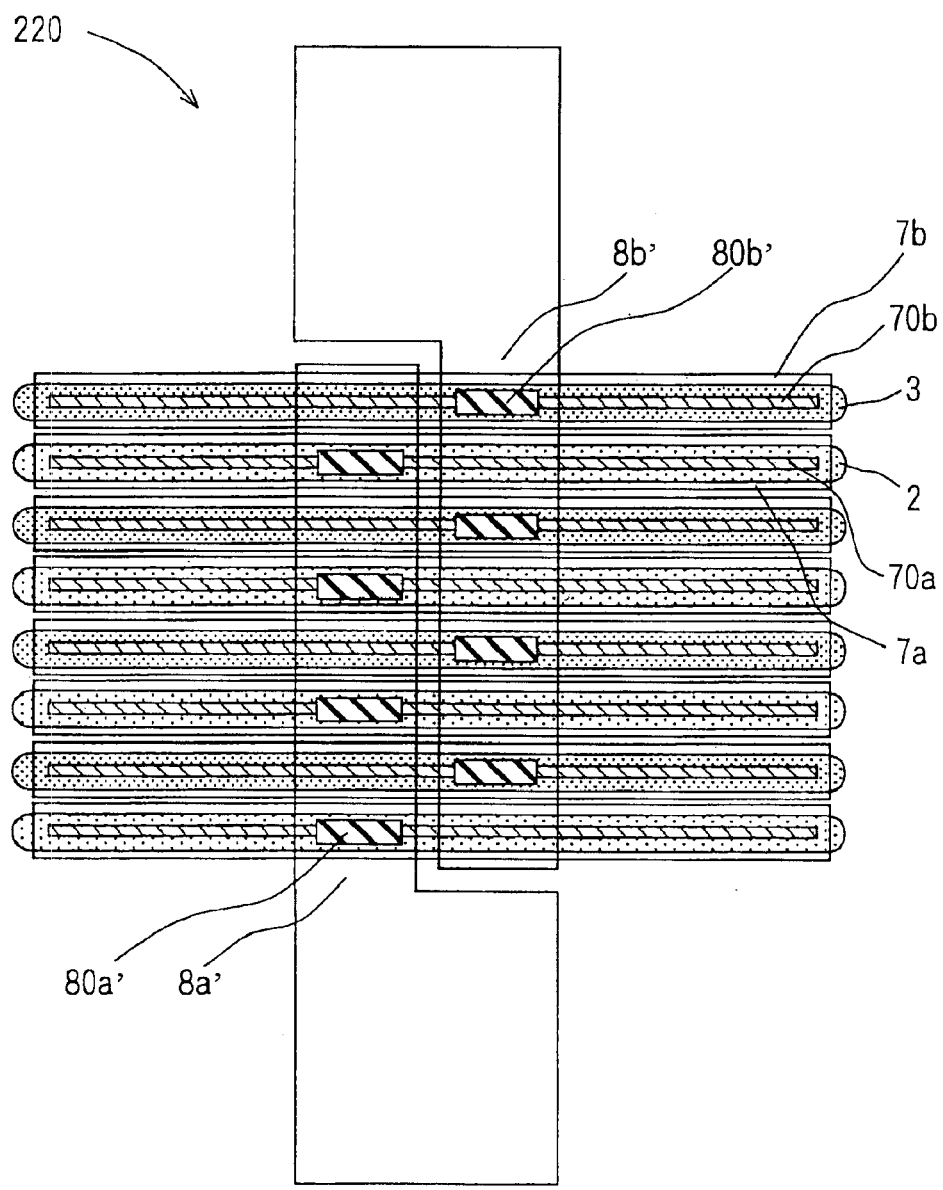
FIG. 5 is a plan view of a PN junction diode according to a third embodiment of the present invention.

FIG. 5 is a plan view of the PN junction diode 220 according to the third embodiment. The PN junction diode 220 according to the third embodiment has electrodes formed as lower layers and connected to the diffusion regions 2 and 3. On the other hand, the lead wire electrodes connected to the electrodes are formed as upper layers.

The PN junction diode 220, as shown in FIG. 5, includes four P-type high impurity concentration diffusion regions 2 and four N-type high impurity concentration diffusion regions 3 which are alternately arranged. On the P-type high impurity concentration diffusion regions 2 and the N-type high impurity concentration diffusion regions 3, electrodes 7a and 7b are formed as lower layers to have connection with the P-type high impurity concentration diffusion regions 2 and N-type high impurity concentration diffusion regions 3 via contacts 70a and 70b, respectively. On the electrodes 7a and 7b, an intermediate insulation film (not shown) is formed. On the intermediate insulation film, a lead wire electrode 8a' is formed as an upper layer, which extends in a direction perpendicular to the longitudinal side direction of the P-type high impurity concentration diffusion regions 2 and of N-type high impurity concentration diffusion regions 3.

Similarly, on the intermediate insulation film, a lead wire electrode 8b' is formed as an upper layer, which extends in a direction perpendicular to the longitudinal side direction of the P-type high impurity concentration diffusion regions 2 and of N-type high impurity concentration diffusion regions 3.

The lead wire electrode 8a' is connected to the P-type high impurity concentration diffusion regions 2 through via-holes 80a', and the lead wire electrode 8b' is connected to the N-type high impurity concentration diffusion regions 3 through via-holes 80b'.

Since the via-holes 80a' and 80b' are arranged at the middle portion of the strip electrodes 7a and 7b, this structure can reduce the surge current flowing through the ends of the P-type high impurity concentration diffusion regions 2 and the N-type high impurity concentration diffusion regions 3. Therefore, it is capable of moderating the concentration of electric current at the ends of the diffusion regions 2 and 3 due to a surge voltage, and suppressing destruction thereat.

In addition, since lead wire electrodes 8a' and 8b' are formed as the upper layers above stripe electrodes 7a and 7b, there is no need for providing the area only occupied by the lead wire electrodes 8a' and 8b'. Thus, although the PN junction diode 220 has a number of diffusion regions 2 and 3, it can reduce the rate of surge current flowing into the ends of the diffusion regions 2 and 3 without increasing the occupied area only by the lead wire electrodes 8a' and 8b'.

[Fourth Embodiment]

Figure 6:
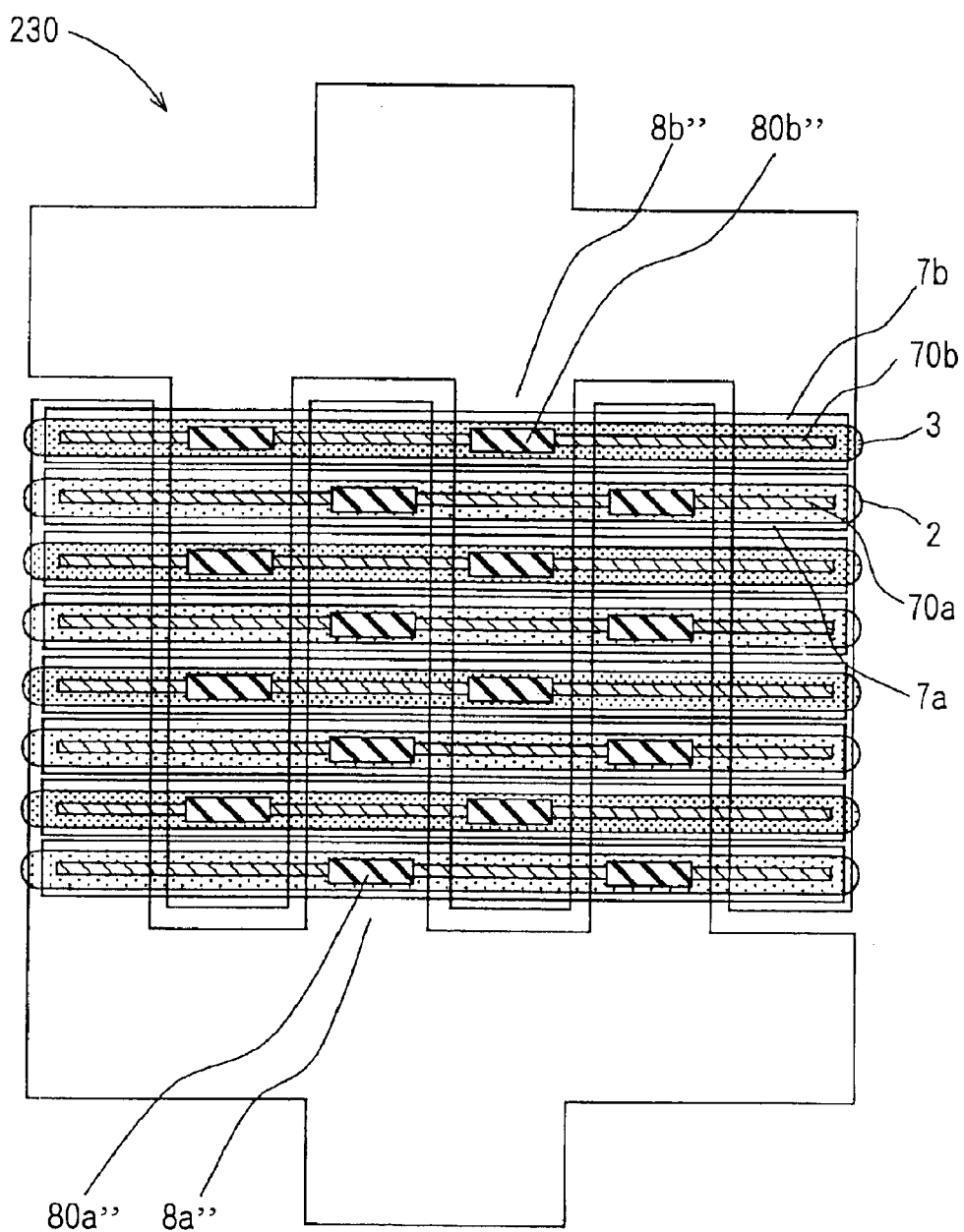
FIG. 6 is a plan view of a PN junction diode according to a fourth embodiment of the present invention.

A PN junction diode 230 according to the fourth embodiment has, as shown in FIG. 6, a comb structure for the lead wire electrodes 8a" and 8b". That is, the lead wire electrode 8a" is formed to have a comb shape, wherein its teeth cover and cross the P-type high impurity concentration diffusion regions 2 and the N-type high impurity concentration diffusion regions 3. Similarly, the lead wire electrode 8b" is formed to have a comb shape, wherein its teeth cover and cross the P-type high impurity concentration diffusion regions 2 and the N-type high impurity concentration diffusion regions 3 in the plan view. The teeth of the lead wire electrodes 8a" and 8b" interlace with each other over the P-type high impurity concentration diffusion regions 2 and the N-type high impurity concentration diffusion regions 3.

The lead wire electrode 8a" as an upper layer is connected to the electrodes 7a (lower layers) on the P-type high impurity concentration diffusion regions 2 through via-holes 80a" except the outmost tooth located at first ends of the P-type high impurity concentration diffusion regions 2 and the N-type high impurity concentration diffusion regions 3. The lead wire electrode 8b" as an upper layer is connected to the electrodes 7b as lower layers on the N-type high impurity concentration diffusion regions 3 through via-holes 80b" except the outmost tooth located second ends of the P-type high impurity concentration diffusion regions 2 and the N-type high impurity concentration diffusion regions 3.

Both the width of each tooth of the lead wire electrodes 8a" and 8b" and the arrangement of the via-holes 80a" and 80b" at the intersections of the lead wire electrodes 8a" and 8b" and electrodes 7a and 7b can be adaptively, i.e., selectively, provided. As a result the current distribution due to surge voltage, i.e., the rate of surge current flowing through the ends of the diffusion regions 2 and 3 can be optimized. This structure increases the withstanding voltage of the PN junction diode against surge voltage with suppression of destruction at the ends of the diffusion regions 2 and 3.

[Fifth Embodiment]

Figure 7A:
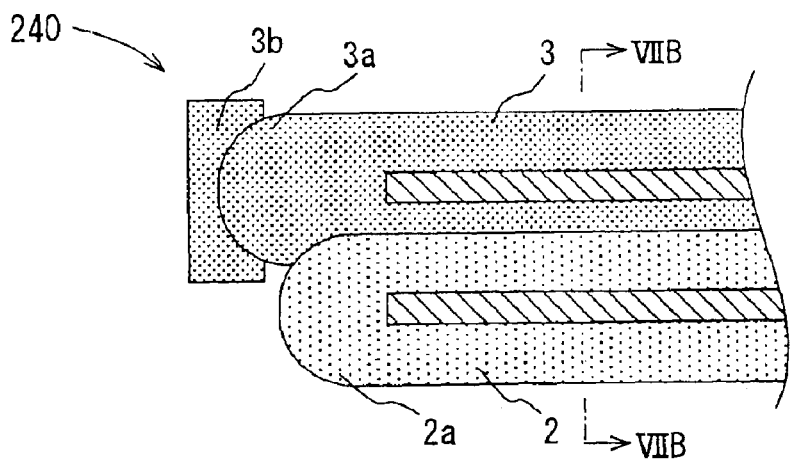
FIG. 7A is a partial plan view of a PN junction diode according to a fifth embodiment.
Figure 7B:
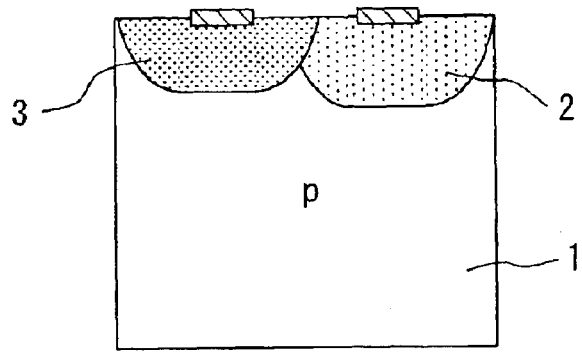
FIG. 7B is a cross-sectional view taken along line VIIB—VIIB in FIG. 7A.

FIG. 7A is a partial plan view of a PN junction diode 240 according to a fifth embodiment, and FIG. 7B is a cross-sectional view taken along line VIIB—VIIB in FIG. 7A. The PN junction diode 240 according to the fifth embodiment has substantially the same structure as the PN junction diode 220 according to the third embodiment (FIG. 5). The difference is that the N-type high impurity concentration diffusion region (cathode) 3 extends or projects beyond the end edge 2a of the P-type high impurity concentration diffusion region (anode) 2 on a semiconductor substrate (p-well) 1. Moreover, the cathode 3 has a low impurity concentration portion 3b at the end edge 3a thereof.

Further, the anode 2 and the cathode 3 have round (circle) edges or chamfered portions 2a and 3a.

More specifically, the cathode 3 extends or projects beyond the end edge 2a of the anode 2, which reduces the high electrostatic intensity at the end edges of the anode 2 and cathode 3, so that destruction at the end edges can be suppressed. Further, the cathode 3 has the low impurity concentration portion 3b at the end 3a thereof, which reduces the high electrostatic intensity at the end edges of the anode 2 and cathode 3, so that destruction at the end edge can also be suppressed.

Corner edges of the stripe cathode 3 are rounded or chamfered to have a semicircle portion or chamfered portion 3a. Moreover, corner edges of the stripe anode 2 are also rounded or chamfered to have a semicircle portion or chamfered portion 2a. This structure also contributes to reduce the high electrostatic intensity at the end edges of the anode 2 and cathode 3, so that destruction at the end edges can be prevented.

[Sixth Embodiment]

Figure 8:
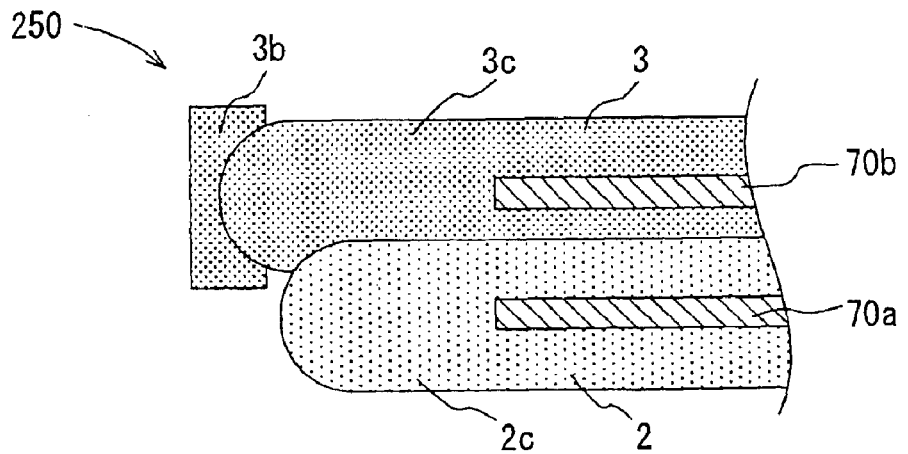
FIG. 8 is a partial plan view of a PN junction diode according to a sixth embodiment.

FIG. 8 is a partial plan view of a PN junction diode 250 according to the sixth embodiment. This PN junction diode 250 has substantially the same structure as the PN junction diode 240 according to the fifth embodiment (FIGS. 7A ad 7B). The difference is that the contacts 70a and 70b formed on the anode 2 and cathode 3 are partially not formed around the ends of anode 2 and the cathode 3 (at portions 2c and 3c). Because the distances from the contacts 70a and 70b to the ends of the anode 2 and cathode 3 become long, this can reduce electric current concentration at the ends of the anode 2 and the cathode 3 due to surge voltage. That is, this structure can suppress electrostatic field intensity from being high at the ends of the anode 2 and cathode 3, thereby increasing the ESD withstanding capability.

[Seventh Embodiment]

In the above embodiments, a P-type silicon substrate is used. However, although not shown, an N-type silicon substrate can be used as a seventh embodiment. In that case, for example, in FIG. 1, the electrode 7b' is equalized to the potential of the diffusion layer of the conductivity which is different from that of the substrate 1. Further, a substrate having an epitaxial layer having a thickness more than 10 ìm including P-type or N-type of a low impurity concentration can be used.

[Eighth Embodiment]

Moreover, in the above embodiments, suppression of concentration of surge current is made regarding a first ends of the P-type high impurity concentration diffusion region 2 and the N-type high impurity concentration diffusion region 3. However, suppression of concentration of surge current may be also made regarding a second ends of the P-type high impurity concentration diffusion region 2 and the N-type high impurity concentration diffusion region 3 as an eighth embodiment. That is, the structure for suppressing the concentration of the surge current may be formed at the both first and second ends of the diffusion regions 2 and 3.

Further, any combination of the structures according to the above-embodiments can be used between the first ends or between the first and second ends.

As mentioned above, the ESD protection diode having a PN junction surely protects circuit elements on the same integrated circuit from ESD by at least one of the following structures:

(1) If the semiconductor substrate supporting anode and cathode is of P-type, an additional electrode is arranged above the edges of anode and cathode, and the potential of the additional electrode is equalized to that of the cathode. If the semiconductor substrate supporting anode and cathode is of N-type, the additional electrode is arranged above the edges of anode and cathode, and the potential of the additional electrode is equalized to that of the anode.

(2) Rectangular edges at the ends of the anode (P-type high impurity concentration diffusion layer) and the cathode (N-type high impurity concentration diffusion layer) are rounded or chamfered.

(3) If the semiconductor substrate supporting anode and cathode is P-type, end edge of the cathode extends beyond the end of the anode. If the semiconductor substrate supporting anode and cathode is N-type, the end edge of the anode extends beyond the end of the cathode.

(4) If the semiconductor substrate supporting anode and cathode is of P-type, the cathode has a low impurity concentration N-type diffusion layer at the end thereof. If the semiconductor substrate supporting anode and cathode is of N-type, the anode has a low impurity concentration P-type diffusion layer at the end thereof.

(5) The contact 70a connecting the anode 2 to the electrode 7a is not provided around the end edges of the anode 2. The contact 70b connects the cathode 3 to the electrode 7b is not provided around the end edges of the cathode 3.

(6) The lead wire electrodes 8a and 8b are connected to only to the intermediate portion or the middle portion of the electrodes 7a and 7b.

For example, the PN junction diode shown in FIGS. 7A and 7B adopts the structure according the items (2) to (4). This moderates the concentration of surge current at end edges of the diffusion regions (anode and cathode). Thus, the PN junction diode shown in FIGS. 7A and 7B can have a superior ESD withstanding capability.

The PN junction shown in FIG. 8 adopts the structure (5) in addition to structures (2) to (4). The structure (5) increases the resistive components in the current path from the contacts 70a and 70b to the end edges, so that the concentration of currents around the end edges can be further reduced, increasing the ESD withstanding capacity.

[Ninth Embodiment]

Figure 9A:
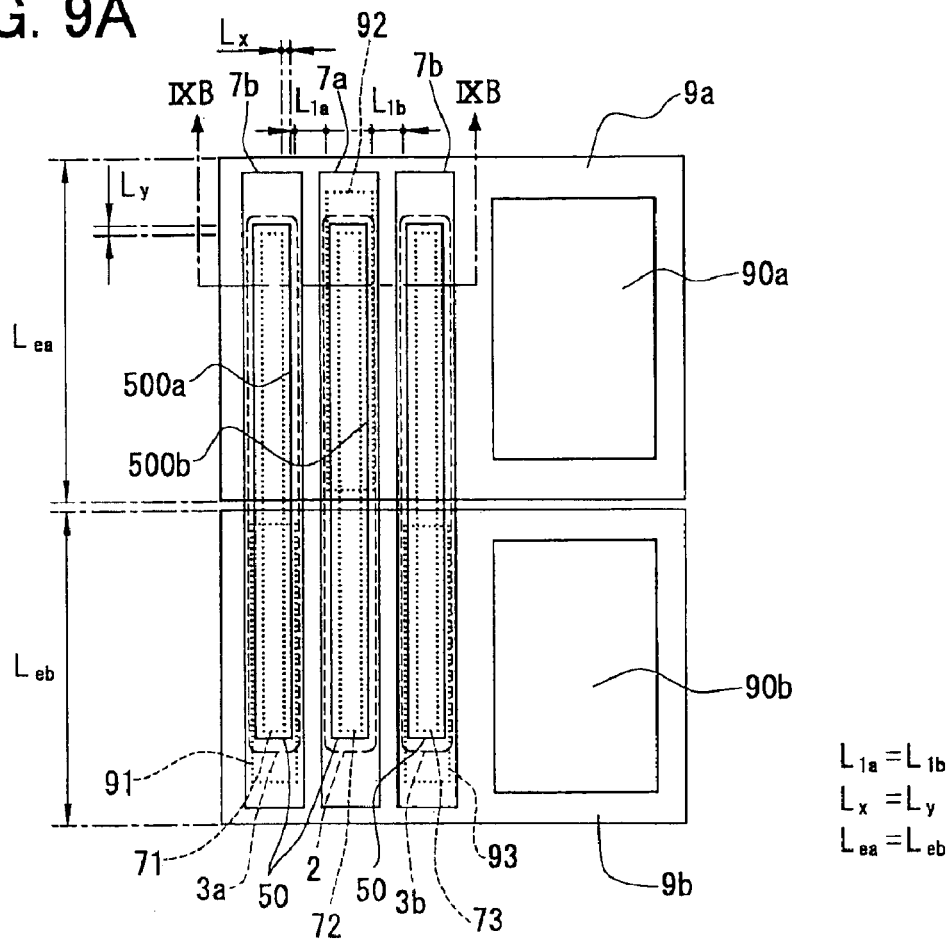
FIG. 9A is a plan view of a PN junction diode according to a ninth embodiment of the present invention.
Figure 9B:
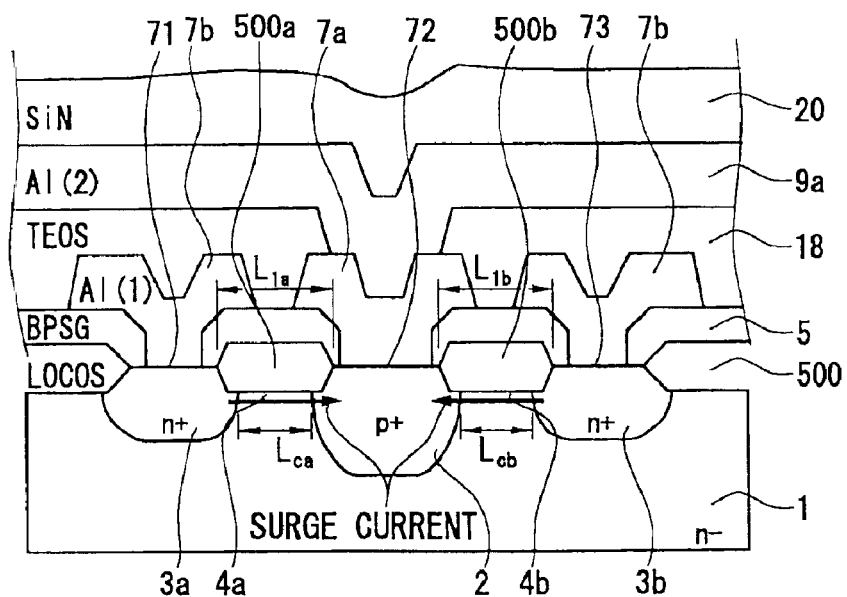
FIG. 9B is a cross-sectional view of the PN junction diode taken along line IXB—IXB in FIG. 9A.
Figure 22A:
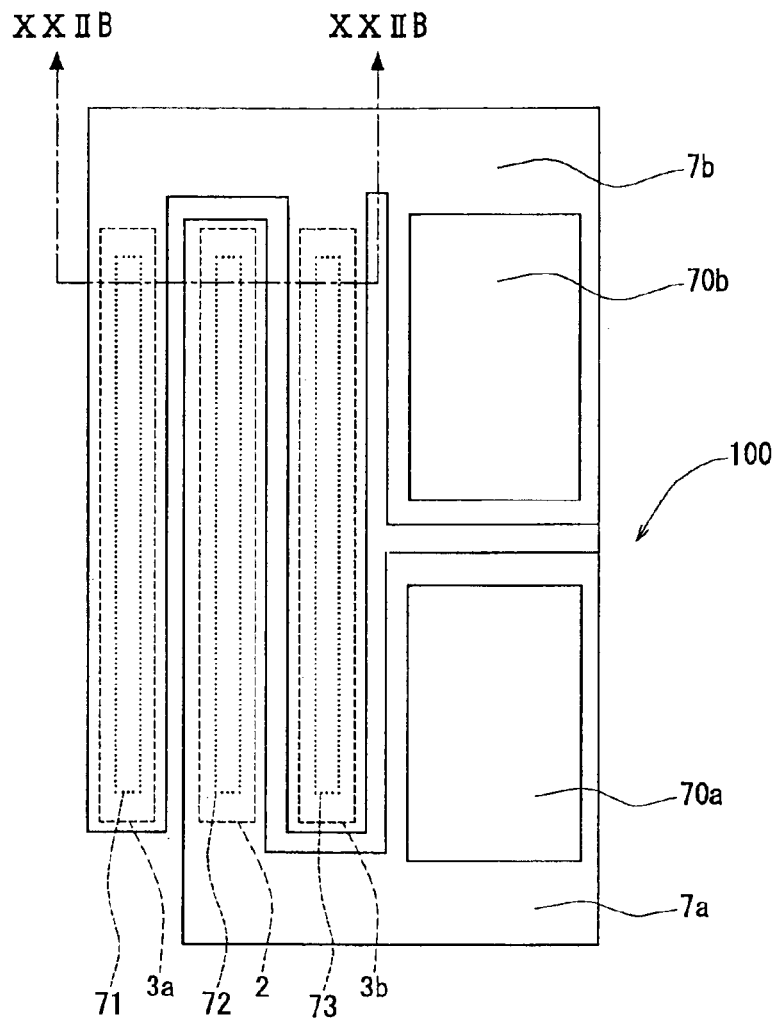
FIG. 22A is a plan view of a related art typical PN junction diode for input/output protection.
Figure 22B:
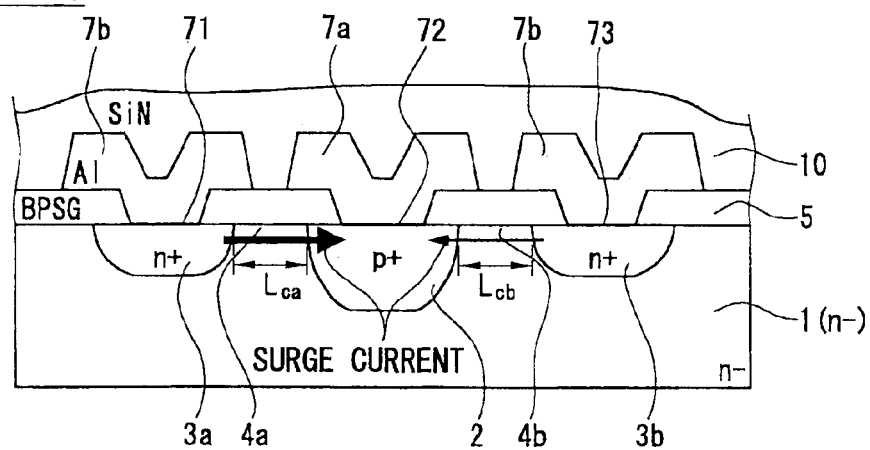
FIG. 22B is an enlarged cross-sectional view taken along line XXIIB—XXIIB in FIG. 22A.
Figure 23A:
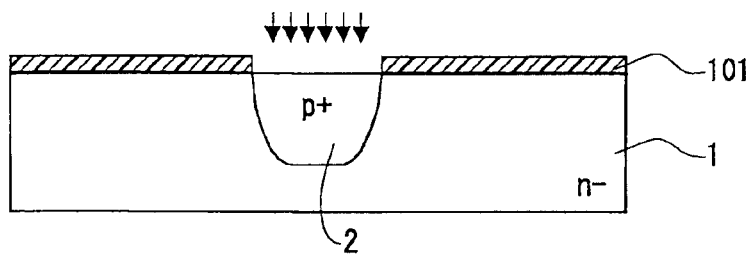
FIGS. 23A to 23E are enlarged cross-sectional views taken along line XXIIB—XXIIB in FIG. 22A in order of production processes.
Figure 23B:
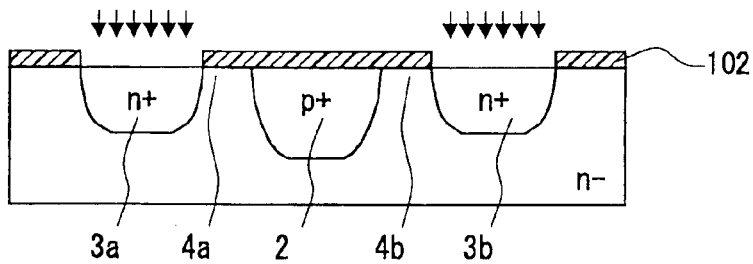
Figure 23C:
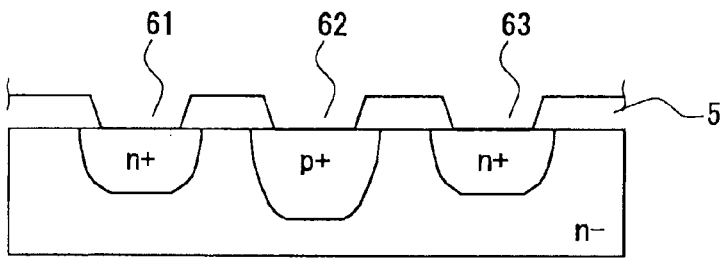
Figure 23D:
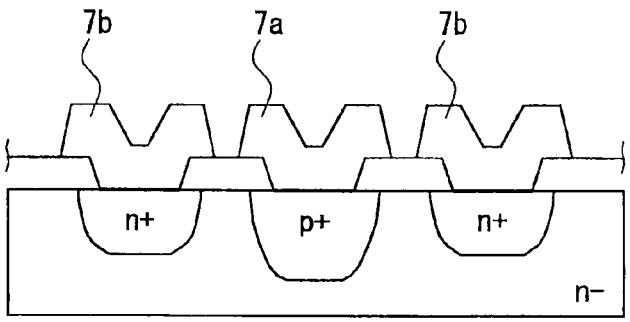
Figure 23E:
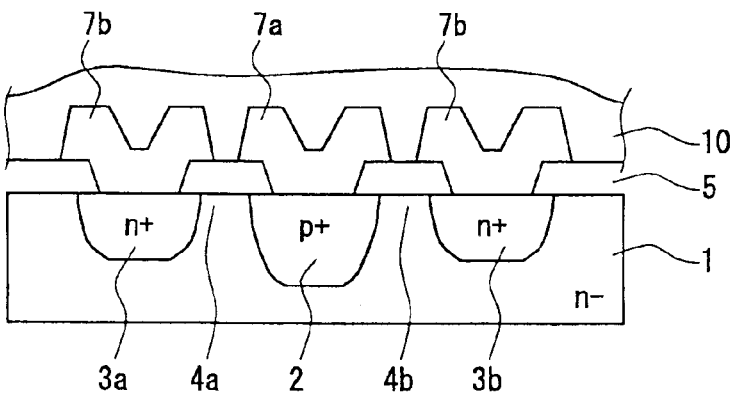

FIGS. 9A and 9B illustrate a PN junction diode according to a ninth embodiment of the present invention. FIG. 9B shows a cross-sectional view of the PN junction diode taken along line IXB—IXB in FIG. 9A. The same or corresponding parts in FIGS. 9A and 9B are designated with the same reference numbers in FIGS. 22A and 22B showing the related art PN junction diode 100.

The PN junction diode shown in FIGS. 9A and 9B includes an N-type low impurity concentration silicon (semiconductor) substrate 1, a P-type high impurity concentration diffusion region 2 as a base in a surface layer of the substrate 1, and N-type high impurity concentration diffusion regions 3a and 3b as an emitter on both sides of the base in the surface layer equidistantly. The N-type low impurity concentration silicon (semiconductor) substrate 1 includes impurity of phosphorus (P) at a concentration of about $1 \times 10^{15}$ cm$^{-3}$. In the plan view of FIG. 9A, each of the P-type high impurity concentration diffusion region 2 and the N-type high impurity concentration diffusion regions 3a and 3b has a rectangle shape of about 10 ìm×500 ìm. Between the P-type high impurity concentration diffusion region 2 and the N-type high impurity concentration diffusion regions 3a and 3b in the surface layer of the substrate 1, PN junction regions 4a and 4b are formed to provide PN junctions.

Further, the PN junction diode includes an LOCOS (Localized Oxidation of Silicon) film 500 which is an insulation protection layer having a relatively high melting point (comparing to the BPSG film and the semiconductor substrate 1). The PN junction regions 4a and 4b are located under bridge portions 500a and 500b of the LOCOS film. The bridge portions 500a and 500b have the same widths $L_{1a}$ and $L_{1b}$ between openings 50, so that the PN junction regions 4a and 4b under the bridge portions 500a and 500b have the same widths $L_{ca}$ and $L_{cb}$, respectively. In FIG. 9A, three openings 50 in LOCOS film 500 are denoted with solid lines. The widths $L_{1a}$ and $L_{1b}$ of the bridge portions 500a and 500b in the LOCOS film 500 are generally set to $L_{1a}=L_{1b}$=about 3 ìm.

On the LOCOS film 500, a lower layer insulation film 5 made of BPSG is formed to cover the LOCOS film 500 and partially cover the surfaces of the P-type high impurity concentration diffusion region 2, and the N-type high impurity concentration diffusion regions 3a and 3b to provide contact regions 71, 72, and 73 (openings on the surfaces of the base and emitters). On the insulation layer 5 and the contact regions 71, 72, and 73, lower layer electrodes 7a and 7b comprising Al are formed. On the lower layer electrodes 7a and 7b and the lower layer insulation film 5, an upper layer insulation film 18 comprising TEOS (Tetraethylorthosilicate) is formed to have openings on the lower layer electrodes 7a and 7b. On the upper layer insulation film 18, upper layer electrodes 9a and 9b are formed so as to connect to the lower layer electrodes 7a and 7b though openings in the upper layer insulation film 18, respectively. Thus, the P-type high impurity concentration diffusion region 2 as the base is connected to the upper layer electrode 9a through the lower layer electrode 7a. The N-type high impurity concentration diffusion regions 3a and 3b as the emitter are connected to the upper layer electrode 9b through the lower layer electrode 7b.

In the plan view of FIG. 9A, the lower layer electrodes 7a and 7b and the upper layers electrodes 9a and 9b are denoted with solid lines. On the other hand, the P-type high impurity concentration diffusion region 2 and the N-type high impurity concentration diffusion regions 3a and 3b, the contact regions 71, 72, and 73, and the contact regions 91, 92, and 93 between the lower and upper layer electrodes are denoted with dotted lines. In this embodiment, distances ($L_x$ and $L_y$) between the openings 50 in the LOCOS film 500 and the contact regions 71, 72 and 73 are equalized around the circumferences of the P-type high impurity concentration diffusion region 2 and the N-type high impurity concentration diffusion regions 3a and 3b ($L_x=L_y$).

Moreover, the lower layer electrode 7a corresponding to the P-type high impurity concentration diffusion region 2 is electrically connected to the upper layer electrode 9a for the base, and the lower layer electrode 7b corresponding to the N-type high impurity concentration diffusion regions 3a and 3b are electrically connected to the upper layer electrode 9b for the emitter. Further, the top surface of the PN junction diode is converted with a protection film 20 comprising SiN. The upper layer electrodes 9a and 9b are externally connected through pads 90a and 90b formed at openings in the protection film 20.

The upper layer electrodes 9a and 9b have rectangular shapes with the same widths $L_{ea}$ and $L_{eb}$ ($L_{ea}=L_{eb}$), cross three openings 50 of the LOCOS film 500, arranged in line and share each of the openings 50 equally. The pads 90a and 90b are arranged side by side on one side of the openings 50.

A method of producing the PN junction diode shown in FIGS. 9A and 9B will be described with reference to FIGS. 10A to 10G. FIGS. 10A to 10G illustrate cross-sectional views taken along line IXB—IXB in FIG. 9A in order of production processes. The production of the PN junction diode shown in FIGS. 10A to 10G is carried out along with production of a CMOS semiconductor device at the different location of the same substrate. Thus, this method will be described with reference to processes of the CMOS device show in FIGS. 11A to 11E.

Figure 10A:
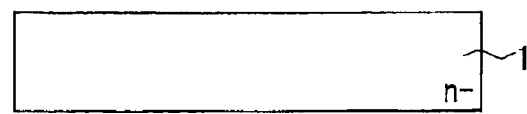
FIGS. 10A to 10G are cross-sectional views taken along line IXB—IXB in FIG. 9A in order of processes.
Figure 11A:
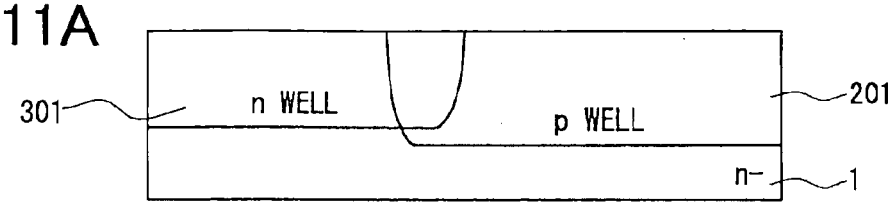
FIGS. 11A to 11E are cross-sectional views illustrating processes for a CMOS semiconductor device formed on the same substrate.

First, the N-type silicon (semiconductor) substrate 1 having a low impurity concentration shown in FIG. 10A is prepared. The N-type silicon substrate 1 contains phosphorus (P) as an impurity at a concentration of about $1\times10^{15}$ $cm^{-3}$. On the other hand at the CMOS forming regions, the N channel MOS portion of the substrate 1 is, as shown in FIG. 11A, ion-injected with boron (B) at a concentration of $1\times10^{13}$ $cm^{-2}$ to provide a P-type well region 201. Similarly, at the P channel MOS portion of the substrate 1 is ion-injected with phosphorus (P) at a concentration of $1\times10^{13}$ $cm^{-2}$ to provide an N-type well region 301.

Figure 10B:
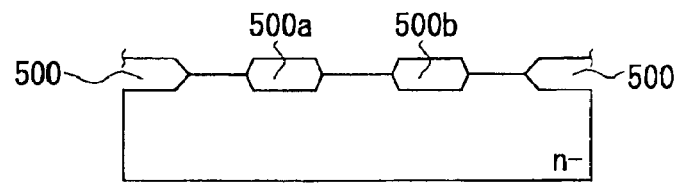
Figure 11B:
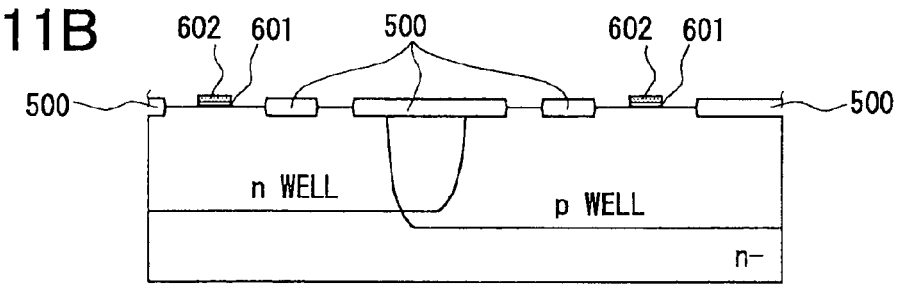

Next, as shown in FIGS. 10B and 11B, the LOCOS films 500, 500a, and 500b as a high melting point protection film having predetermined openings are formed through general processes as follows:

First, on an entire current top surface of the N-type silicon substrate 1, SiN film, being a mask on thermal oxidation is deposited and subsequently subjected to etching with a mask of a resist having the predetermined openings corresponding to openings for LOCOS film forming locations. Next, thermal oxidation is effected to the surface of silicon exposed through the openings of the SiN film to form the LOCOS film 500, 500a, and 500b. Finally, the SiN film mask is removed. The thickness of the LOCOS film 500 is about 0.6 ìm. As shown in FIG. 11B, at the CMOS forming region, after forming the LOCOS films 500, a gate oxide film 601 comprising a silicon oxide film and a gate electrode 602 comprising a polysilicon film are formed by a generally used method.

Figure 10C:
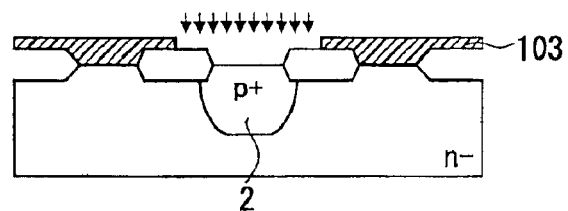
Figure 11C:
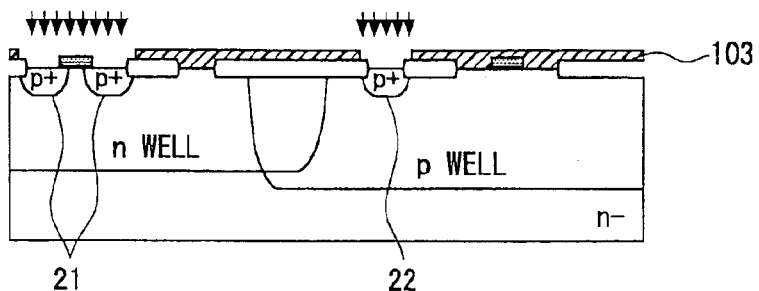

Next, as shown in FIG. 10C, a first resist 103 is formed to cover the openings corresponding to the emitter in the LOCOS film 500, 500a and 500b, and then, boron (B) is ion-injected with the LOCOS film as a substantial mask into the substrate 1 through the openings corresponding to the base at a concentration of $2\times10^{14}$ $cm^{-2}$. After this, thermal treatment is made at a temperature not less than 1000° C. for several hours to form P-type high impurity concentration diffusion region 2 for the base. The diffusion depth of the P-type high impurity concentration diffusion region 2 is about 3 ìm. At the same time, as shown in FIG. 11C, at the CMOS forming locations, a P-type high concentration diffusion regions 21 and 22 corresponding to P channels are formed.

Figure 10D:
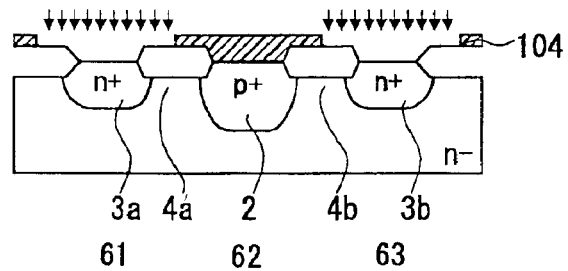
Figure 11D:
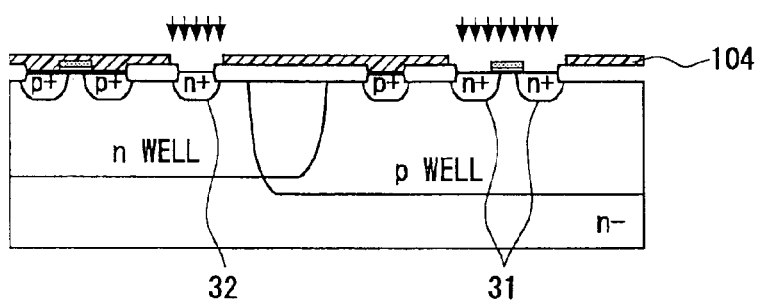

After this, as shown in FIG. 10D, the first resist 103 is removed, and then, the openings of the LOCOS film corresponding to the base are covered with a second resist 104. Next, phosphorus (P) is ion-injected into the substrate 1 with the LOCOS film as a substantial mask through the openings corresponding to the emitter at a concentration of $4\times10^{16}$ $com^{-2}$. After this, a thermal treatment is performed at a temperature not less than 1000° C. for about one hour to form N-type high impurity concentration diffusion regions 3a and 3b on both sides of the P-type high impurity concentration diffusion region 2. The diffusion depth of the N-type high impurity concentration diffusion regions 3a and 3b is about 2 ìm. These processes provide PN junction regions 4a and 4b at the semiconductor portion between the P-type high impurity concentration diffusion region 2 and the N-type high impurity concentration diffusion regions 3a and 3b. In the same process, at the CMOS forming locations, N-type high impurity concentration diffusion regions 31 and 32 corresponding to the N channels are formed as shown in FIG. 11D.

Figure 10E:
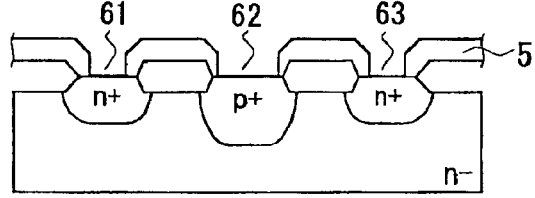

Subsequently, the second resist 104 is removed as shown in FIG. 10E, and then, a BPSG film is deposited on the entire current top surface as the lower layer insulation film 5. Further, openings 61, 62, and 63 are formed in the BPSG film for contacts for the P-type high impurity concentration diffusion region 2 and N-type high impurity concentration diffusion regions 3a and 3b, wherein the thickness of the BPSG film is about 0.6 ìm.

Figure 10F:
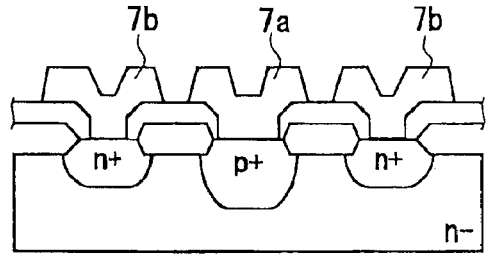

As shown in FIG. 10F, Al is deposited over the entire current top surface to have an Al film of about 1 ìm thickness, which is patterned to form the lower layer electrodes 7a and 7b.

Figure 11E:
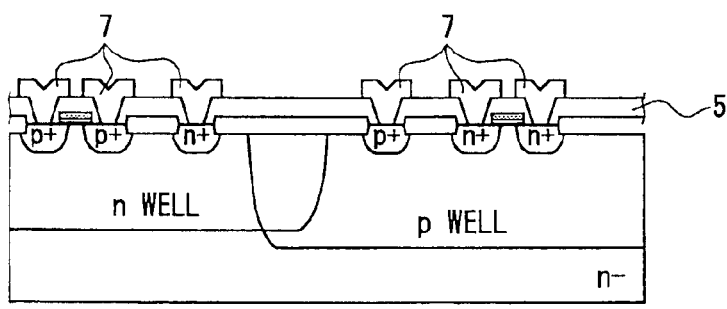

At the CMOS forming locations, as shown in FIG. 11E, the lower layer insulation film 5 comprising a BPSG film and the lower layer electrode 7 comprising Al are formed by the processes shown in FIGS. 10E and 10F.

Figure 10G:
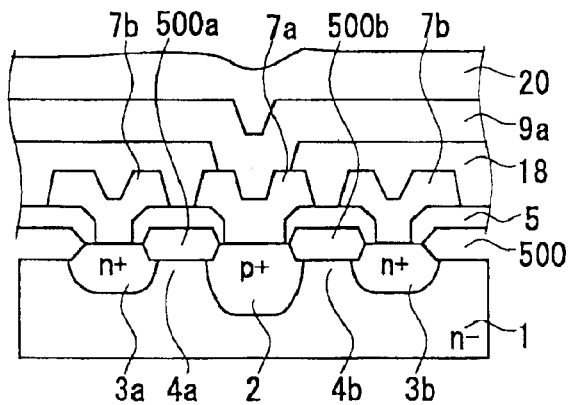

Next, as shown in FIG. 10G, the TEOS film as the upper layer insulation film 18 is deposited, and then, openings corresponding to the lower layer electrodes 7a and 7b are formed. After this, an Al film is deposited over the entire current top surface. Subsequently, the Al film is patterned to have a predetermined configuration to form the upper layer electrodes 9a and 9b. Finally, SiN film is deposited over the entire current top surface as the protection film 20, and then, the openings for the pads 90a and 90b for external connection are formed to complete the PN junction diode shown in FIGS. 9A and 9B. It is to be noted that, at each CMOS forming location, the CMOS semiconductor device is completed via the same process as that in FIG. 10G after the process shown in FIG. 11E According to the method of producing the PN junction diode as shown in FIGS. 10A to 10G, the P-type high impurity concentration diffusion region 2 for the base and the N-type high impurity concentration diffusion regions 3a and 3b for the emitter are provided by ion-injection with the same LOCOS film 500, 500a and 500b as a mask. Thus, in the processes in FIGS. 10A to 10G, there is no alignment operation between masks, that is, there is no alignment error of masks. Accordingly, when the widths of the bridge portions 500a and 500b of the LOCOS film 500 is equally set, the widths $L_{ca}$ and $L_{cb}$ of the PN junction regions 4a and 4b on both sides of the base can be equalized after impurity diffusion. Therefore, the same withstanding voltages can be obtained at the both PN junction regions 4a and 4b. Further, the PN junction regions 4a and 4b are formed under the bridge portions 500a and 500b of the LOCOS film 500. Because the LOCOS film has a higher melting point than the BPSG and the substrate 1, the PN junction diode can withstands the increase in temperature at the PN junction region 4a and 4b due to application of surge.

[Tenth Embodiment]

The ninth embodiment has described the configuration and producing method of the PN junction diode wherein the N-type high impurity concentration diffusion regions for the emitter are arranged on both sides of the P-type high impurity concentration diffusion region for the base, by utilizing the bridge portions of the LOCOS film having the same width covering the PN junction regions.

As for the PN junction diodes for input/output protection for semiconductor devices, generally, tens of PN junction diodes are connected in parallel on the same semiconductor substrate to protect the circuitry on the substrate from a large magnitude of surge current.

The PN junction diode according to a tenth embodiment has a plurality of PN junction diodes connected in parallel. That is, the PN junction diode has three sets of PN junction diode structures, each corresponding to the PN junction diode according to the ninth embodiment.

Figure 12:
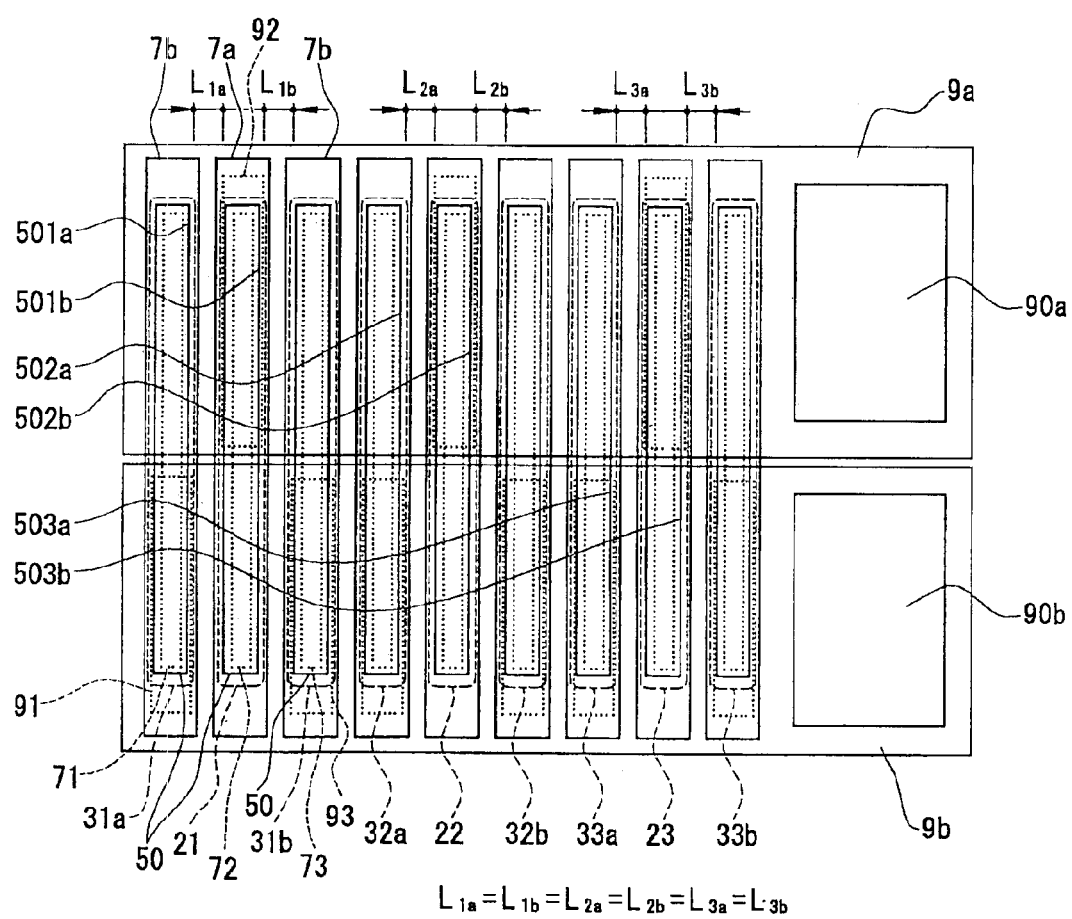
FIG. 12 is a plan view of a PN junction diode according to a tenth embodiment.

FIG. 12 is a plan view of the PN junction diode according to the tenth embodiment. The same or corresponding parts in FIGS. 9A and 9B are designated with like references. Thus, the detailed description will be omitted.

As shown in FIG. 12, three P-type high impurity concentration diffusion regions 21, 22, and 23 are formed as center regions. Two N-type high impurity concentration diffusion regions 31a, 31b, 32a, 32b, 33a, and 33b are arranged on both sides of each of the center regions, respectively. All of the bridge portions 501a, 501b, 502a, 502b, 503a, and 503b of the LOCOS film have the same widths $L_{1a}, L_{1b}, L_{2a}, L_{2b}, L_{3a},$ and $L_{3b}$. Further, three P-type high impurity concentration diffusion regions 21, 22, and 23 are connected to the upper layer electrode 9a. Six N-type high impurity concentration diffusion regions 31a, 31b, 32a, 32b, 33a, and 33b are connected to the upper layer electrode 9b. The PN junction diode in the tenth embodiment can be produced in the same method as that in the ninth embodiment with modification in masks for the plural PN junction structures.

Also in this embodiment, because the widths $L_{1a}, L_{1b}, L_{2a}, L_{2b}, L_{3a},$ and $L_{3b}$ of the six bridge portions 501a, 501b, 502a, 502b, 503a and 503b which have a high melting point and respectively cover the PN junction regions are equalized to each other, the six PN junction regions can have the same width, so that the six PN junction regions have the same withstanding voltage. This structure provides a withstanding current magnitude three times the PN junction diode shown in FIGS. 9A and 9B.

The PN junction diode shown in FIG. 12 has only six PN junction regions connected in parallel. However, even if tens of PN junction regions connected in parallel, the PN junction regions can have the same width by using the bridge portions having the same width, so that the withstanding current magnitude can be increased in proportional to the number of sets of the PN junction regions of the ninth embodiment.

[Eleventh Embodiment]

The tenth embodiment discloses the PN junction diode having a plurality (three) of sets of PN junction structure of the ninth embodiment connected in parallel. The eleventh embodiment relates to a PN junction diode wherein a plurality of base and emitter regions is alternately arranged. More specifically, in the PN junction diode of the eleventh embodiment, four P-type high impurity concentration diffusion regions as the base regions, and five N-type high impurity concentration diffusion regions as the emitter regions are alternately arranged to have eight PN junction regions for example.

Figure 13:
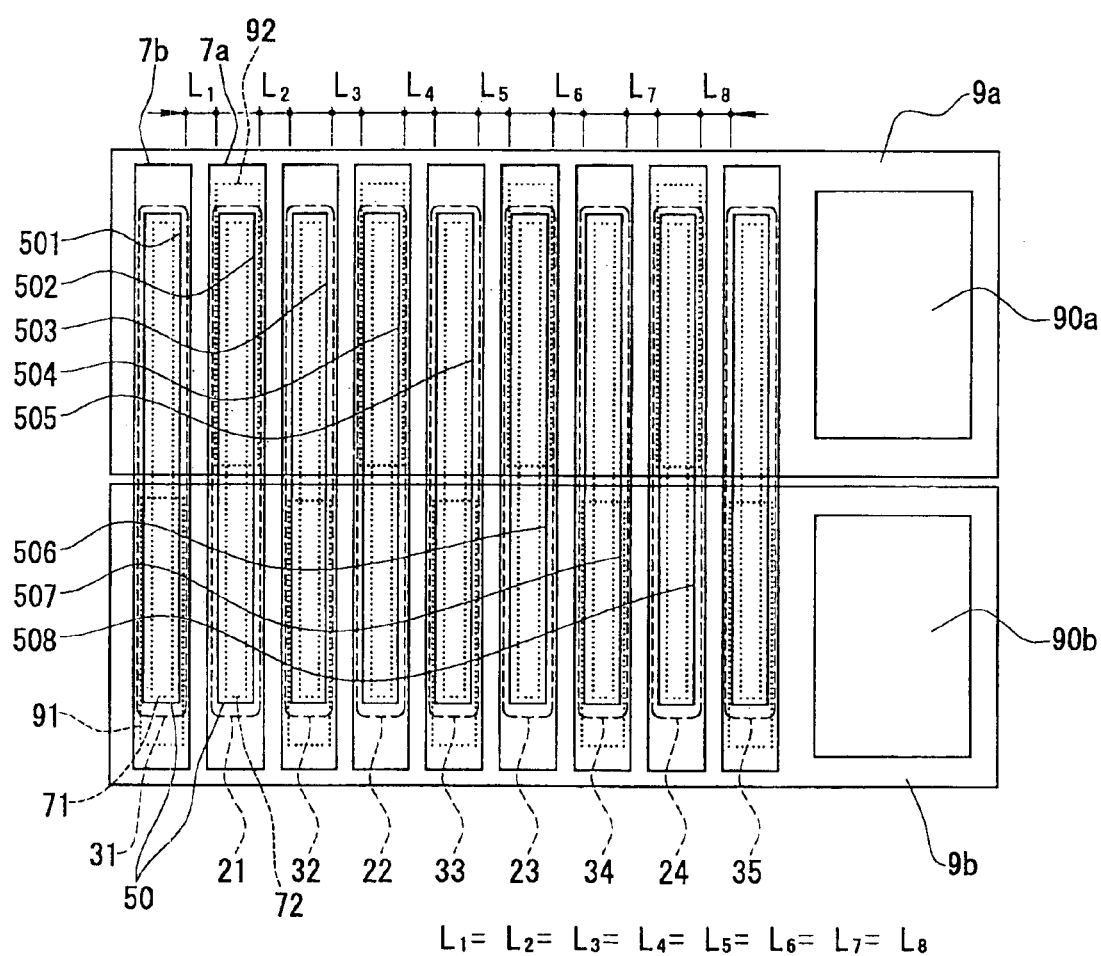
FIG. 13 is a plan view of a PN junction diode according to an eleventh embodiment.

FIG. 13 is a plan view of the PN junction diode according to this embodiment. The same parts in the ninth embodiment are designated with the like references in FIG. 13, and thus the detailed description will be omitted.

As shown in FIG. 13, four P-type high impurity concentration diffusion regions 21, 22, 23, and 24 and five N-type high impurity concentration diffusion regions 31, 32, 33, 34, and 35 are alternately arranged.

The bridge portions 501, 502, 503, 504, 505, 506, 507, and 508 of the LOCOS film have the same widths $L_1, L_2, L_3, L_4, L_5, L_6, L_7,$ and $L_8$. Four P-type high impurity concentration diffusion regions 21, 22, 23, and 24 are connected to the upper layer electrode 9a. Five N-type high impurity concentration diffusion regions 31, 32, 33, 34, and 35 are connected to the upper layer electrode 9b. The PN junction diode according to the eleventh embodiment can be produced in the same method as that according to the ninth embodiment with modification in masks for the plural PN junction structures.

Therefore, also in this embodiment, because the widths $L_1, L_2, L_3, L_4, L_5, L_6, L_7,$ and $L_8$ of the bridge portions of the LOCOS film covering the PN junction regions are equally provided, the eight PN junction regions have the same width, so that the eight PN junction regions have the same withstanding voltage. Here, although the PN junction diode shown in FIG. 12 has six PN junction regions, the PN junction diode shown in FIG. 13 has eight PN junction regions in spite of the same occupation area. Therefore, the PN junction diode in FIG. 13 provides 4/3-times withstanding current magnitude comparing to the PN junction diode in FIG. 12. In other words, if they have the same withstanding current capability, the PN junction diode shown in FIG. 13 can be provided with ¾ of area that would be occupied by the PN junction diode shown in the FIG. 12

In the PN junction diode shown in FIG. 13, eight PN junction regions are connected in parallel. In the case that tens of PN junctions are connected in parallel in order to ensure a requisite withstanding capability against surge current, the PN junction regions similarly have the same width by using the bridge portions having the same width, so that the withstanding current capability of the diode can be increased in proportional to the number of the bridge portions.

[Twelfth Embodiment]

The PN junction diodes according to the ninth to eleventh embodiments include the P-type high impurity concentration diffusion regions for the base and the N-type high impurity concentration diffusion regions for the emitter, wherein both have the same size rectangles. The PN junction diode according to a twelfth embodiment has different size of rectangles between the P-type high impurity concentration diffusion regions and the N-type high impurity concentration diffusion regions.

Figure 14:
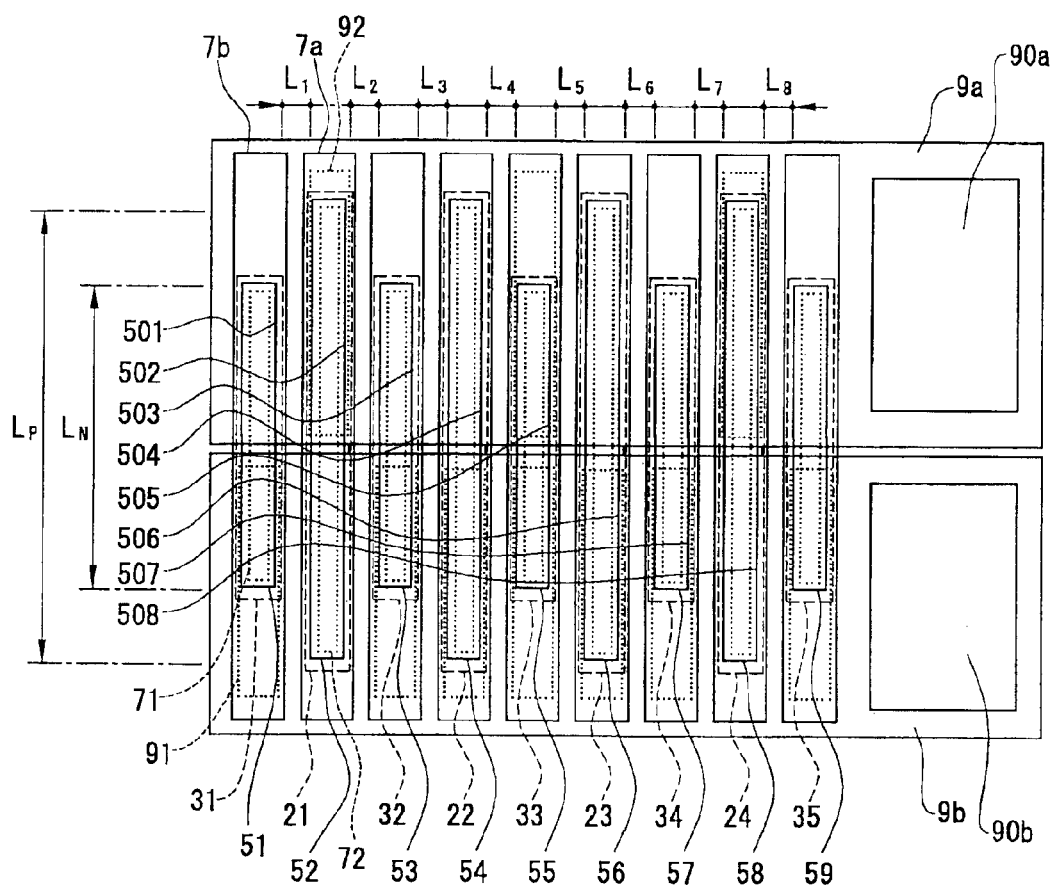
FIG. 14 is a plan view of a PN junction diode according to a twelfth embodiment.

FIG. 14 is a plan view of the PN junction diode according to the twelfth embodiment. The same parts in the eleventh embodiment are designated with like references in FIG. 14. Thus, the detailed description will be omitted.

As shown in FIG. 14, the P-type high impurity concentration diffusion regions 21, 22, 23, and 24 and the N-type high impurity concentration diffusion regions 31, 32, 33, 34, and 35 are alternately arranged. The bridge portions 501, 502, 503, 504, 505, 506, 507, 508 have the same widths $L_1$, $L_2$, $L_3$, $L_4$, $L_5$, $L_6$, $L_7$, and $L_8$ like the PN junction diode according to the eleventh embodiment shown in FIG. 13. The difference is in that the longitudinal size $L_P$ of four LOCOS openings 52, 54, 56, and 58 for the P-type high impurity concentration diffusion regions is different from the longitudinal size $L_N$ of five LOCOS openings 51, 53, 55, 57, and 59 for the N-type high impurity concentration diffusion regions.

If the P-type high impurity concentration diffusion regions and the N-type high impurity concentration diffusion regions having the same dimensions are arranged side by side as shown in FIG. 13, surge current tends to concentrate at end edges of the neighboring P-type high impurity concentration diffusion region and the N-type high impurity concentration diffusion region comparing to the middle portions thereof. Therefore, if a surge current of a large magnitude exceeding the withstanding capability occurs, corners of diffusion regions may be destroyed.

In this embodiment, the PN junction diode shown in FIG. 14 has different longitudinal sizes $L_P$ and $L_N$ of LOCOS openings for forming the P-type high impurity concentration diffusion regions and N-type high impurity concentration diffusion regions so as to have longer distances between neighboring corners than the widths $L_1=L_2=L_3=L_4=L_5=L_6=L_7=L_8$ of the bridge portions. Therefore, the resistance of the current path between the neighboring corner edges of the P-type high impurity concentration diffusion region and the N-type high impurity concentration diffusion region is greater than that of the current path in the PN junction region formed under the bridge portion. This structure moderates concentration of the electric surge current at corner edges of the P-type high impurity concentration diffusion regions and the N-type high impurity concentration diffusion regions, so that destruction at the corners can be suppressed.

Regarding making the difference in the longitudinal length between the P-type high impurity concentration diffusion region and the N-type high impurity concentration diffusion region, if the substrate is of N-type, the corner edge of the P-type high impurity concentration diffusion region may be readily destroyed. Therefore, in order to prevent the current concentration at the corner edges, it is desirable to make the longitudinal length $L_P$ of the P-type high impurity concentration diffusion region for the base greater than the longitudinal length $L_N$ of the N-type high impurity concentration diffusion region for the emitter. Inversely, if the substrate is of P-type, because the corners of the N-type high impurity concentration diffusion region may be readily destroyed, it is desirable to make the longitudinal length $L_N$ of the N-type high impurity concentration diffusion region for the emitter greater than the longitudinal length $L_P$ of the P-type high impurity concentration diffusion region for the base. This embodiment is applicable to ninth and tenth embodiments.

[Thirteenth Embodiment]

In the PN junction diodes according to the ninth to twelfth embodiments, a distance between the contact region for the lower layer electrode and the LOCOS opening is constant around the circumference. More specifically, as shown in FIGS. 9A and 9B, distances ($L_x$ and $L_y$) between the openings in the LOCOS film 500 and the contact regions for the P-type high impurity concentration diffusion region 2 and the N-type high impurity concentration diffusion regions 3a and 3b are equalized around the circumferences of the contact regions ($L_x=L_y$).

In this embodiment, the distance ($L_x$) between the longitudinal sides of the contact region and the LOCOS opening 50 is different from the distance ($L_y$) between the transverse sides of the contact region and the LOCOS opening 50.

Figure 15:
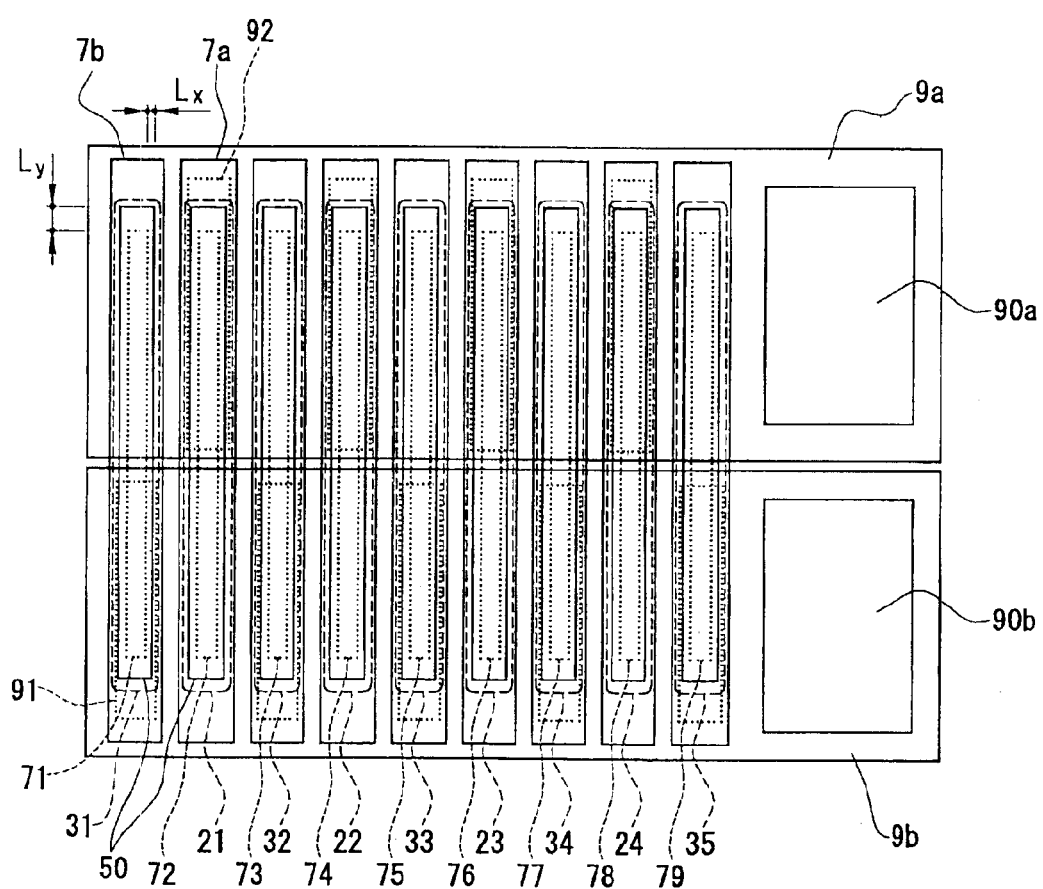
FIG. 15 is a plan view of a PN junction diode according to a thirteenth embodiment.

FIG. 15 is a plan view of a PN junction diode according to the thirteenth embodiment. The same parts in the eleventh embodiment are designated with like reference, and will not be discussed here.

As shown in FIG. 15, the PN junction diode according to this embodiment, the distance $L_y$ between the contact region 71 (72, 73, 74, 75, 76, 77, 78, and 79) and the LOCOS opening 50 at each end (transverse side) of the contact region 71 and the LOCOS opening 50 is greater than the distance $L_x$ between the longitudinal sides of the contact region 71 and the LOCOS opening 50 ($L_x<L_y$).

The lower layer electrodes 7a and 7b have a lower resistivity than the high impurity concentration diffusion regions 21, 22, 23, 24, 31, 32, 33, 34, and 35. Therefore, making the distance $L_y$ at the transverse sides of the rectangles greater than the distance $L_x$ at the longitudinal sides of the rectangles (near the bridge portions) increases the resistance of current path to the ends (transverse sides) of high impurity concentration diffusion regions. This decreases the magnitude of current flowing into the end edges of the high impurity concentration diffusion regions, and thus can moderate the concentration of surge currents flowing into the end edges. This embodiment is applicable to ninth to twelfth embodiments.

[Fourteenth Embodiment]

In the ninth to eleventh embodiments, the PN junction diodes include the P-type high impurity concentration diffusion region for the base and the N-type high impurity concentration diffusion regions for the emitter, both having the same rectangular shape, i.e., having corners of the rectangular shape.

In this embodiment, each of P-type high impurity concentration diffusion regions and the N-type high impurity concentration diffusion regions has a straight stripe shape having round (semicircle) edges.

Figure 16:
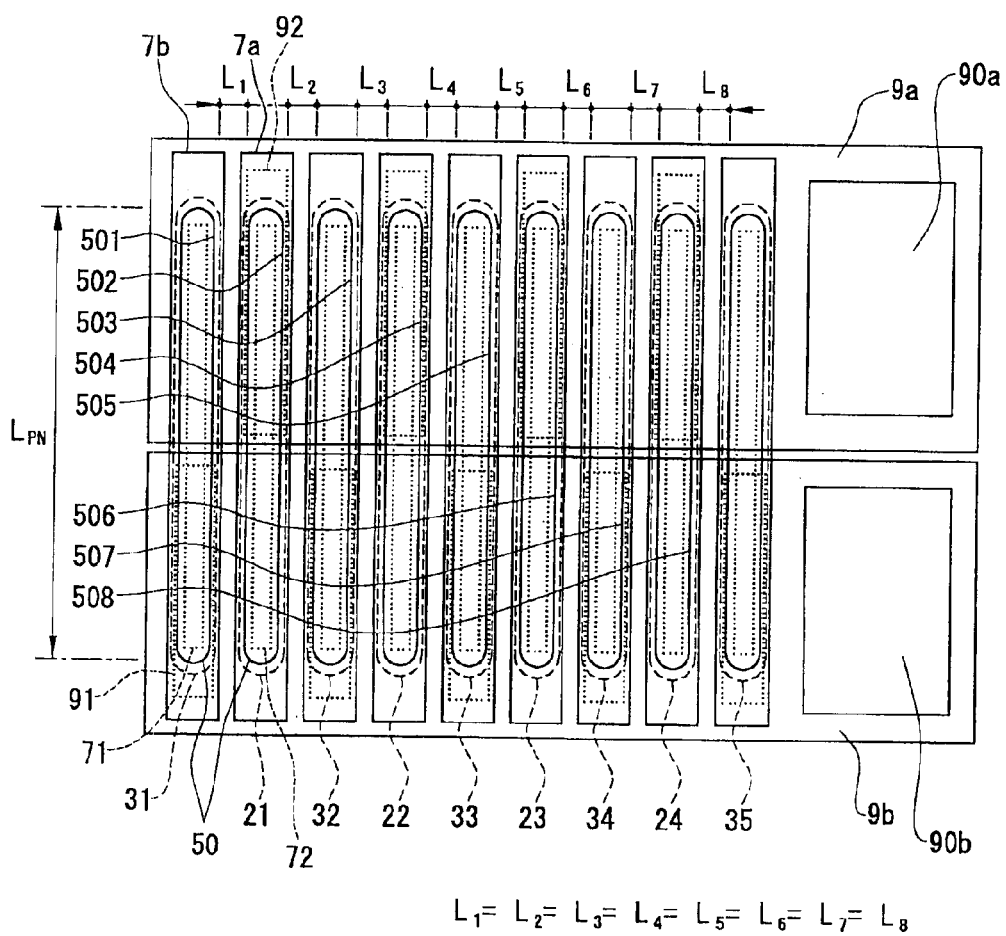
FIG. 16 is a plan view of a PN junction diode according to a fourteenth embodiment.

FIG. 16 is a plan view of a PN junction diode according to the fourteenth embodiment. The same parts in the eleventh embodiment are designated with like references in FIG. 16 and will not be discussed in detail here.

As shown in FIG. 16, the P-type high impurity concentration diffusion regions 21, 22, 23, and 24 and the N-type high impurity concentration diffusion regions 31, 31, 33, 34, and 35 are alternately arranged. The bridge portions 501,

502, 503, 504, 505, 506, 507, and 508 of the LOCOS film 500 have the same widths $L_1$, $L_2$, $L_3$, $L_4$, $L_5$, $L_6$, $L_7$, and $L_8$ like the eleventh embodiment. In the eleventh embodiment, the end edges of openings 50 have rectangular corners. On the other hand, the PN junction diode in FIG. 16 includes openings 50 corresponding to the P-type high impurity concentration diffusion rejoins and the N-type high impurity concentration diffusion regions, the openings 50 having round end edges in which the rectangular corners are rounded.

In this embodiment, the neighboring LOCOS openings 50 for the P-type high impurity concentration diffusion region and the N-type high impurity diffusion region have round edges at ends of straight stripes. Accordingly, the distance between the neighboring ends can be made longer than bridge portion's widths $L_1=L_2=L_3=L_4=L_5=L_6=L_7=L_8$. This prevents surge currents from concentrating at the ends of the neighboring P-type high impurity concentration diffusion region and N-type high impurity diffusion region.

Moreover, in the PN junction diode shown in FIG. 14, the PN junction region has the substantial length $L_N$. On the other hand, the PN junction diode shown in FIG. 16 has a PN junction region of a length $L_{PN}$ ($L_{PN}=L_P>L_N$). Accordingly, the PN junction diode shown in FIG. 16 has a larger withstanding current capacity against a surge current than the PN junction diode shown in FIG. 14.

Further, the PN junction diode shown in FIG. 16 includes the LOCOS openings 50 of which the end edges are rounded. On the other hand, the contact regions 71 and 72 for high impurity condition diffusion regions 21 and 31 have rectangular shapes, so that the distance between the transverse sides of the contact regions 71 and 72 and the LOCOS openings 50 at the both ends becomes greater than the distance between the longitudinal sides thereof. Therefore, like the thirteenth embodiment, this structure also decreases the current flowing into the ends of the P-type and N-type high impurity concentration diffusion regions, thereby suppressing the concentration of surge currents at the ends thereof. This embodiment is applicable to ninth to thirteenth embodiments.

[Fifteenth Embodiment]

The twelfth embodiment has disclosed the PN junction diode including the P-type high impurity concentration diffusion regions and the N-type high impurity concentration diffusion regions, both of which have rectangular shapes of the longitudinal sizes different from each other. The fourteenth embodiment has disclosed the PN junction diode including the P-type high impurity concentration diffusion regions and the N-type high impurity concentration diffusion regions, having the same size stripe shapes of which both ends are rounded. In the fifteenth embodiment, low impurity concentration diffusion well regions are attached to both ends of the diffusion regions, in addition to that the P-type and N-type high impurity concentration diffusion regions are different in size. Each of the low impurity concentration diffusion well regions has the same conductivity type as the diffusion region attached thereto.

Figure 17A:
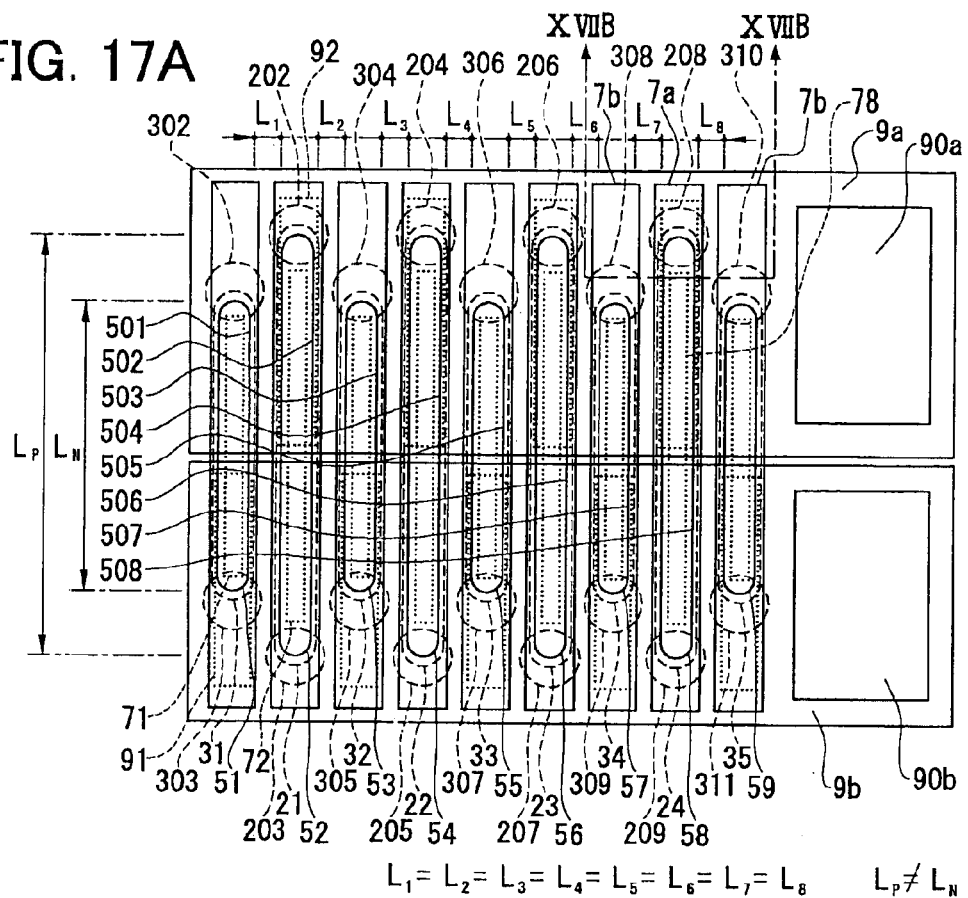
FIG. 17A is a plan view of a PN junction diode according to a fifteenth embodiment.
Figure 17B:
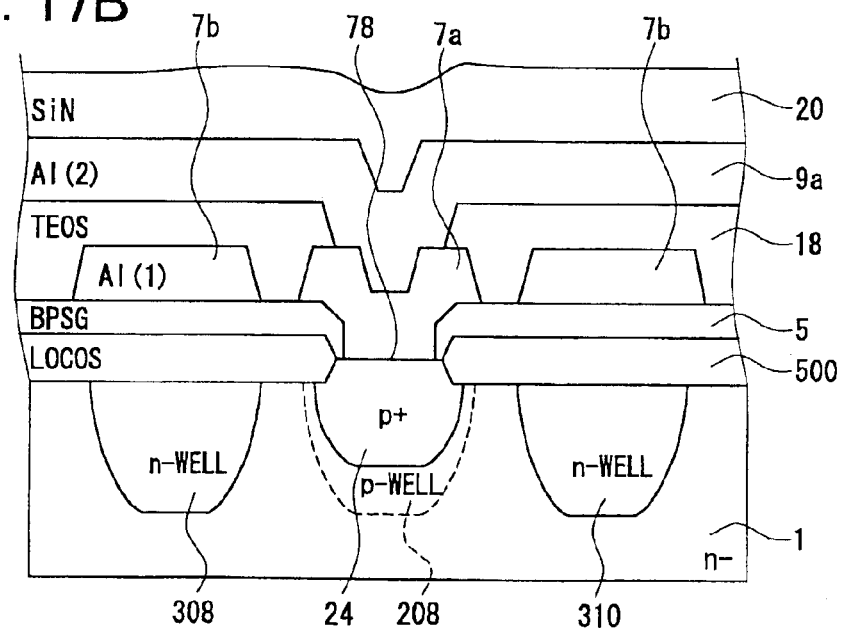
FIG. 17B is an enlarged cross-sectional view taken along line XVIIB—XVIIB in FIG. 17A.

FIG. 17A is a plan view of the PN junction diode according to the present embodiment. FIG. 17B is an enlarged cross-sectional view taken along line XVIIB—XVIIB in FIG. 17A. The same parts in the twelfth embodiment are designated with like references in FIGS. 17A and 17B and will not be discussed here.

As shown in FIG. 17A, the P-type high impurity concentration diffusion regions 21, 22, 23, and 24 and the N-type high impurity concentration diffusion regions 31, 32, 33, 34, and 35 are alternately arranged. The longitudinal length $L_P$ of four LOCOS openings 52, 54, 56, and 58 for the P-type high impurity diffusion regions is different from the longitudinal length $L_N$ of five LOCOS openings 51, 53, 55, 57, and 59 for the N-type high impurity concentration diffusion regions. The bridge portions 501, 502, 503, 504, 505, 506, 507, and 508 of the LOCOS film 500 have the same widths $L_1$, $L_2$, $L_3$, $L_4$, $L_5$, $L_6$, $L_7$, and $L_8$. The LOCOS openings 52, 54, 56, and 58 for the P-type high impurity concentration diffusion regions and the LOCOS openings 51, 53, 55, 57, and 59 for the N-type high impurity concentration diffusion regions have straight stripes with round end edges. Further, at the round end edges, low impurity concentration diffusion wells 202 to 209, and 302 to 311 with the same conductivity type as the diffusion regions attached are formed. The diffusion depth of the low impurity concentration diffusion wells 202 to 209 and 302 to 311 are about 5 ìm.

The PN junction diode according to the present embodiment can be produced as follows:

First, the low impurity concentration diffusion wells 202 to 209 and 302 to 311 are formed. Next, the remaining processes are conducted in accordance with the production processes shown in FIGS. 10A to 10G according to the ninth embodiment. The low impurity concentration diffusion wells 202 to 209 and 302 to 311 can be formed together with the CMOS circuit at the same time if the formation conditions are the same as those of the P type well region and the N type well region shown in FIG. 11A.

In this embodiment, the low impurity concentration diffusion wells of the same conductivity type as the diffusion regions are formed in the surface layer of the substrate 1 to cover the termination portions of the P-type and N-type high impurity concentration diffusion regions. This can prevent surge current from concentrating at the termination portions, thereby increasing the withstanding voltage thereat.

In the PN junction diode shown in FIGS. 17A and 17B, the P-type high impurity concentration diffusion regions and the N-type high impurity diffusion regions have the rounded end edges as the end configurations thereof in addition to formation of the low impurity concentration diffusion wells. Further, the longitudinal size of the P-type high impurity concentration diffusion regions is different from that of the N-type high impurity diffusion regions like the twelfth embodiment. Thus, the PN junction diode shown in FIGS. 17A and 17B has a larger withstanding capability at end portions against a large magnitude of surge current.

The low impurity concentration diffusion wells can be formed in the PN junction diodes according to the ninth to fourteenth embodiments.

[Sixteenth Embodiment]

In the ninth to fifteenth embodiments, the upper layer electrodes have rectangular shapes, that is, the width thereof is constant. The PN junction diode according to the sixteenth embodiment has upper layer electrodes 9a and 9b of which widths over the P-type high impurity concentration diffusion regions and the N-type high impurity diffusion regions vary (decrease) with distances from the pads 90a and 90b. That is, the widths of the upper layer electrodes 9a and 9b become greater, as approaching their pads 90a and 90b.

Figure 18:
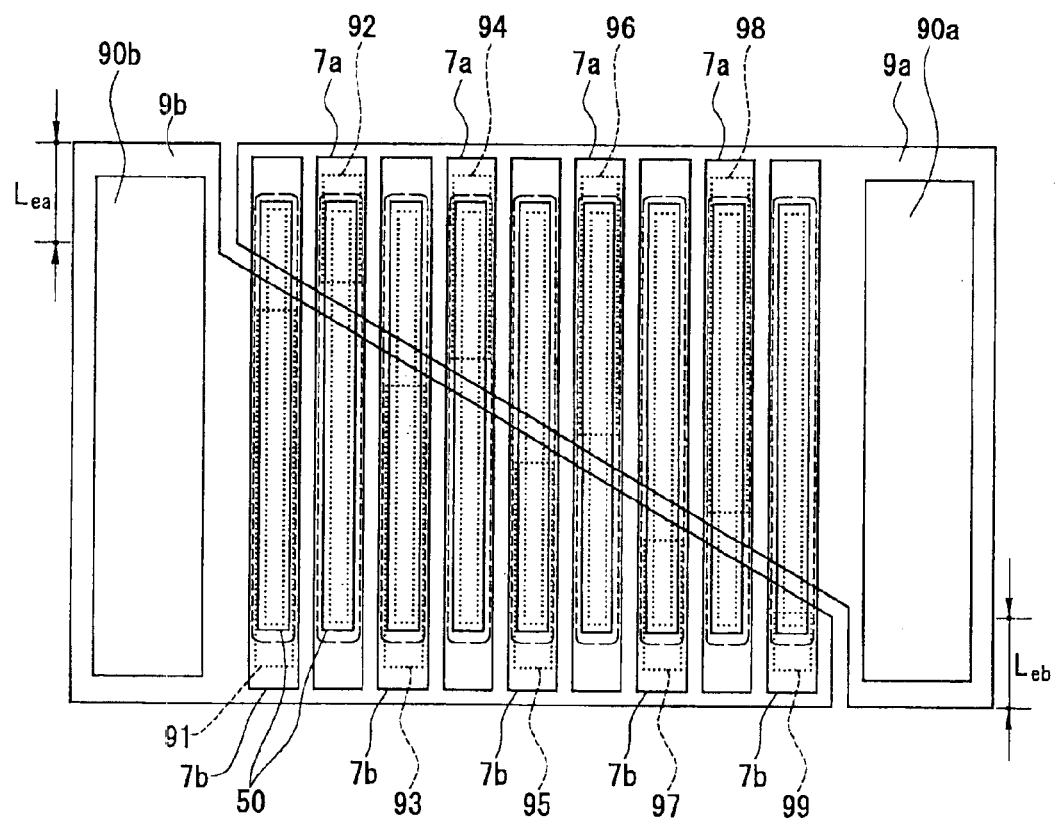
FIG. 18 is a plan view of a PN junction diode according to a sixteenth embodiment.

FIG. 18 is a plan view of the PN junction diode according to the present embodiment. The same parts as the eleventh embodiment are designated with the same reference numbers in FIG. 18 and a detail description will be omitted here.

The PN junction diode, as shown in FIG. 18 has the pads 90a and 90b on the both sides of the LOCOS openings 50. Each of the widths $L_{ea}$ and $L_{eb}$ of the upper layer electrodes 9a and 9b increases as the measuring point approaches each of the pad 90a and 90b. Accordingly, the lengths of contact regions 92, 94, 96, and 98 for connecting the lower layer electrodes 7a to the upper layer electrode 9a increase as the measuring point approaches the pad 90a. Similarly, the lengths of contact regions 91, 93, 95, 97, and 99 for connecting the lower layer electrodes 7b to the upper layer electrode 9b increase as the measuring point approaches the pad 90b. It is to be noted that the shortest widths $L_{ea}$ and $L_{eb}$ of the upper layer electrodes 9a and 9b are set to be greater than the widths of the lower layer electrodes 7a and 7b.

A surge current enters the PN junction diode from one of pads and exits from the other pad. Thus, the upper layer electrodes 9a and 9b conduct large magnitudes of surge currents as near as the pads 90a and 90b. Accordingly, making the electrode width near the pad greater can conduct the surge current uniformly into plural diffusion regions. This prevents destruction near pads 90a and 90b due to the surge current. This embodiment is applicable to ninth to fifteenth embodiment.

[Seventeenth Embodiment]

The fourteenth embodiment disclosed the PN junction diode including the same size of straight stripes with round end edges of the P-type high impurity concentration diffusion regions and the N-type high impurity diffusion regions. The PN junction diode according to the seventeenth embodiment has the P-type high impurity concentration diffusion regions and the N-type high impurity concentration diffusion regions coaxially arranged.

Figure 19A:
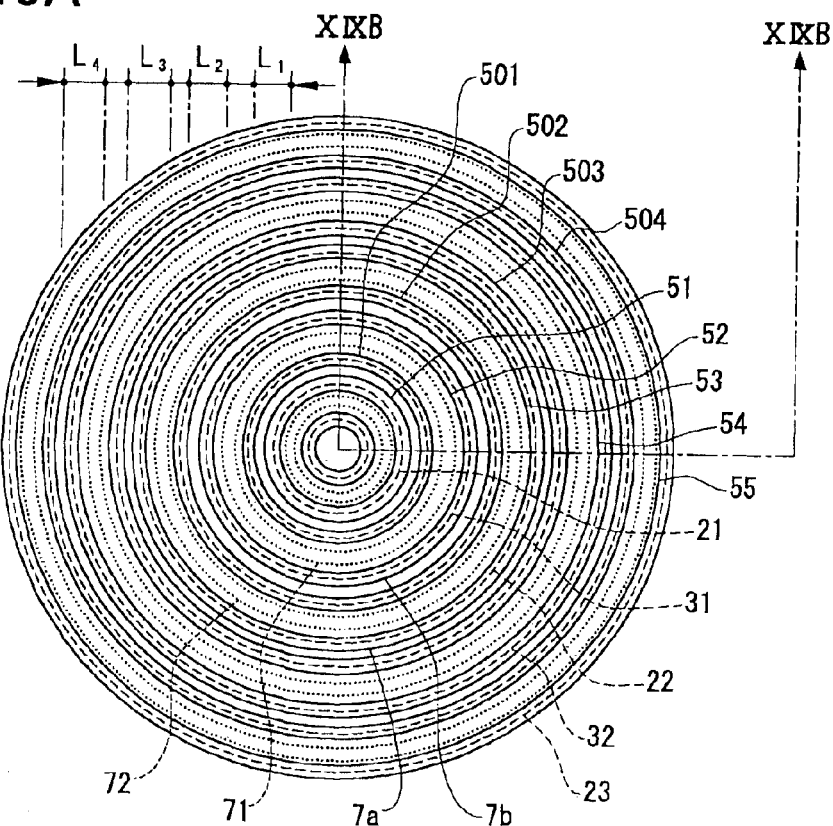
FIG. 19A is a plan view of a PN junction diode according to a seventeenth embodiment.
Figure 19B:
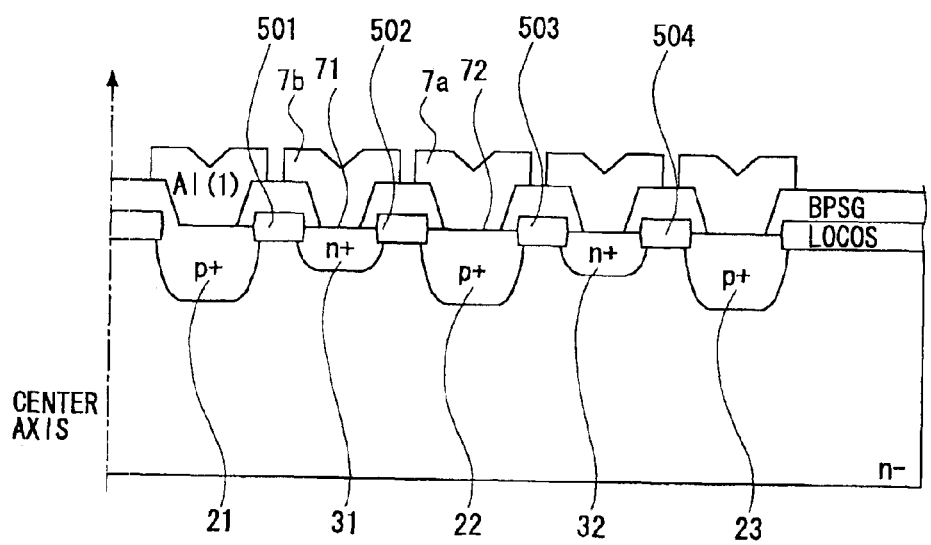
FIG. 19B is a cross-sectional view taken along line XIXB—XIXB in FIG. 19A.

FIG. 19A is a plan view of the PN junction diode according to the seventeenth embodiment. FIG. 19B is a cross-sectional view taken along line XIXB—XIXB in FIG. 19A. The same parts in the fourteenth embodiment are designated with the same reference numbers in FIGS. 19A and 19B, and the detailed description will be omitted. Moreover, in FIGS. 19A and 19B, the upper layer insulation film 18 comprising TEOS, the upper layer electrodes 9a and 9b comprising Al, and the protection film 20 comprising SiN are omitted in the drawings.

As shown in FIGS. 19A and 19B, three P-type high impurity concentration diffusion regions 21, 22, and 23 and two N-type high impurity concentration diffusion regions 31 and 32 are alternately, equidistantly, coaxially arranged. The bridge portions 501, 502, 503 and 504 of the LOCOS film 500 have the same widths $L_1$, $L_2$, $L_3$, and $L_4$.

In the PN junction diode shown in FIG. 19A, five LOCOS openings 51, 52, 53, 54, and 55 and the corresponding P-type high impurity concentration diffusion regions and the N-type high impurity concentration diffusion regions, are formed to have ring shapes coaxially arranged. Thus, there are no end edges which are inherent to the rectangular type diffusion regions. Accordingly, concentration of surge currents at corner end edges does not occur, so that surge currents uniformly flow in radial directions over all circumferences of rings. Thus, the PN junction regions in FIGS. 19A and 19B are arranged without useless space, so that a miniaturized PN junction diode can be provided in comparison with the PN junction diode shown in FIG. 16.

[Eighteenth Embodiment]

The PN junction diodes according to the ninth to seventeenth embodiments improve the surge withstanding capability by optimizing the configurations and arrangement of the P-type high impurity concentration diffusion regions and the N-type high impurity concentration diffusion regions. The PN junction diode according to this embodiment further includes a third P-type high impurity concentration diffusion region surrounding the PN junction regions for grounding.

Figure 20A:
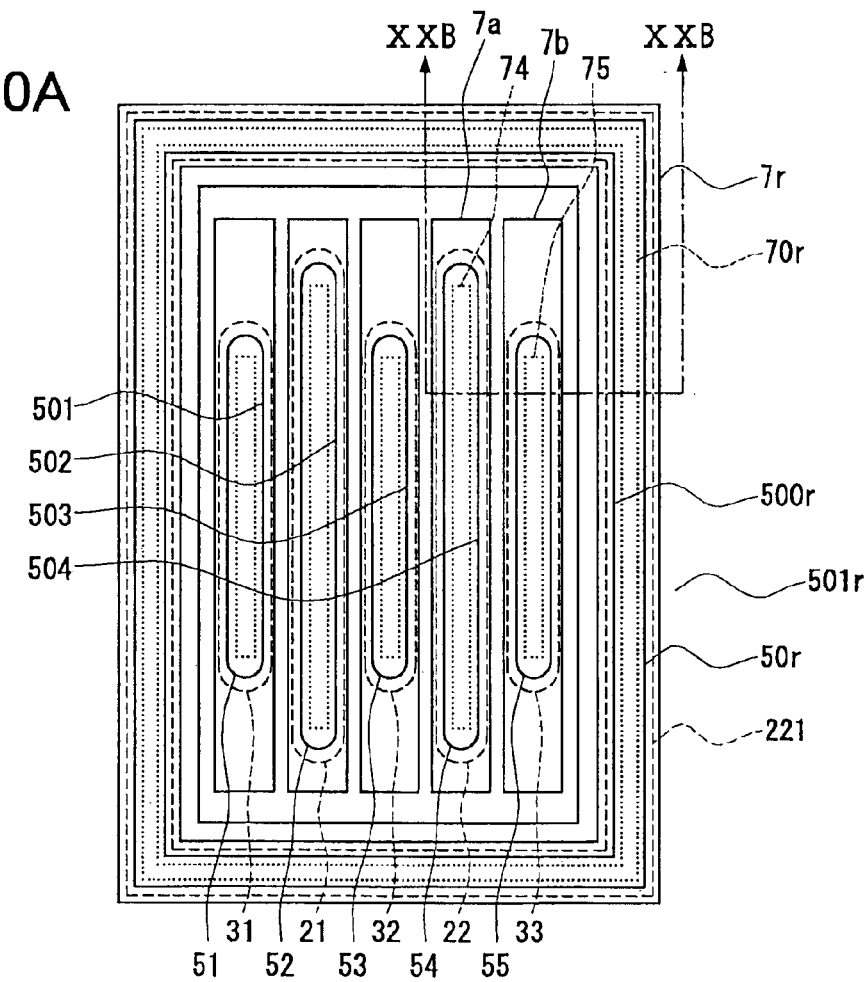
FIG. 20A is a plan view of a PN junction diode according to an eighteenth embodiment.
Figure 20B:
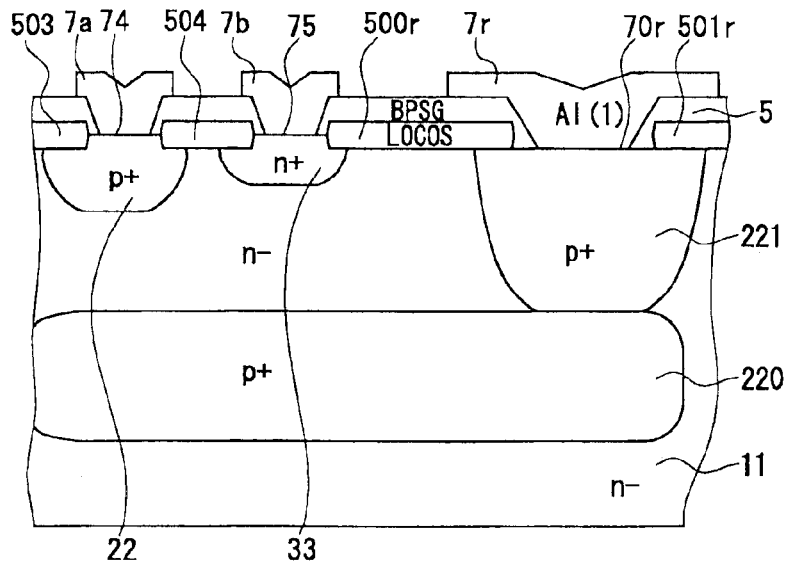
FIG. 20B is a cross-sectional view taken along line XXB—XXB in FIG. 20A.

FIG. 20A is a plan view of PN junction diode according to the present embodiment, and FIG. 20B is a cross-sectional view taken along line XXB—XXB in FIG. 20A. The same parts in the twelfth embodiment are designated with the same reference numbers in FIGS. 20A and 20B, and the detailed description will be omitted. Further, in FIGS. 20A and 20B, the upper layer insulation film 18 comprising TEOS, the upper layer electrodes 9a and 9b comprising Al, and the protection film 20 comprising SiN which were shown in FIGS. 9A and 9B are omitted in the drawings.

The PN junction diode shown in FIGS. 20A and 20B includes two P-type high impurity concentration diffusion regions 21 and 22 and three N-type high impurity concentration diffusion regions 31, 32, and 33 alternately arranged. Further, under these five diffusion regions 21, 22, 31, 32, and 33, a third P-type high impurity concentration diffusion region 220 is formed, and these five diffusion regions 21, 22, 31, 32, and 33 are surrounded by an opening 50r in the LOCOS film to have circumferences 500r and 501r, and the third p-type high impurity concentration diffusion region 221 corresponding to the opening 50r. The third P-type high impurity concentration diffusion regions 220 and 221 are connected, as shown in FIG. 20B, to be grounded through the contact 70r and the electrode 7r.

The PN junction diode shown in FIGS. 20A and 20B is produced as follows:

First, a silicon oxide film is deposited on an N-type low impurity concentration silicon (semiconductor) substrate 11, and then openings are formed at predetermined portions. After this, boron (B) is ion-injected under a condition of $1 \times 10^{13}$ cm$^{-2}$ to form the third high impurity concentration diffusion region 220 as a P-type berried layer. Next, the silicon oxide film is removed, and then the N-type low impurity concentration silicon layer is formed by the epitaxial growth. After this, at a predetermined portion, boron (B) is ion-injected under a condition of $1 \times 10^{13}$ cm$^{-2}$ to form the third P-type high impurity concentration diffusion region 221 as an isolation layer. This completes the third high impurity concentration diffusion regions 220 and 221 surrounding the diode forming area. The subsequent processes are carried out in accordance with the processes shown in FIGS. 10A to 10G to form the PN junction diode of the ninth embodiment.

According to the embodiment, the third P-type high impurity concentration diffusion regions 220 and 221, which are to be grounded, surround the PN junction diode. Thus, if a surge current is too large to absorb in the PN junction regions and is about to leak therefrom, the third P-type high impurity concentration diffusion regions 220 and 221 absorb the noise (injected electrons, holes), which is a leaking surge current. This prevents an erroneous operation in a logic circuit due to the noise caused by the surge current in the peripheral semiconductor circuitry. This embodiment is applicable to the former embodiments.

[Ninteenth Embodiment]

The eighteenth embodiment has disclosed the PN junction diode surrounded by the third p-type high impurity concentration diffusion regions to absorb the surge current leaking from the PN junction diode due to a large magnitude of surge current, in order to prevent an erroneous operation of the semiconductor circuitry formed around the PN junction diode. In the nineteenth embodiment, the diode forming area is surrounded by insulation regions instead of the third P-type high impurity concentration diffusion regions.

Figure 21A:
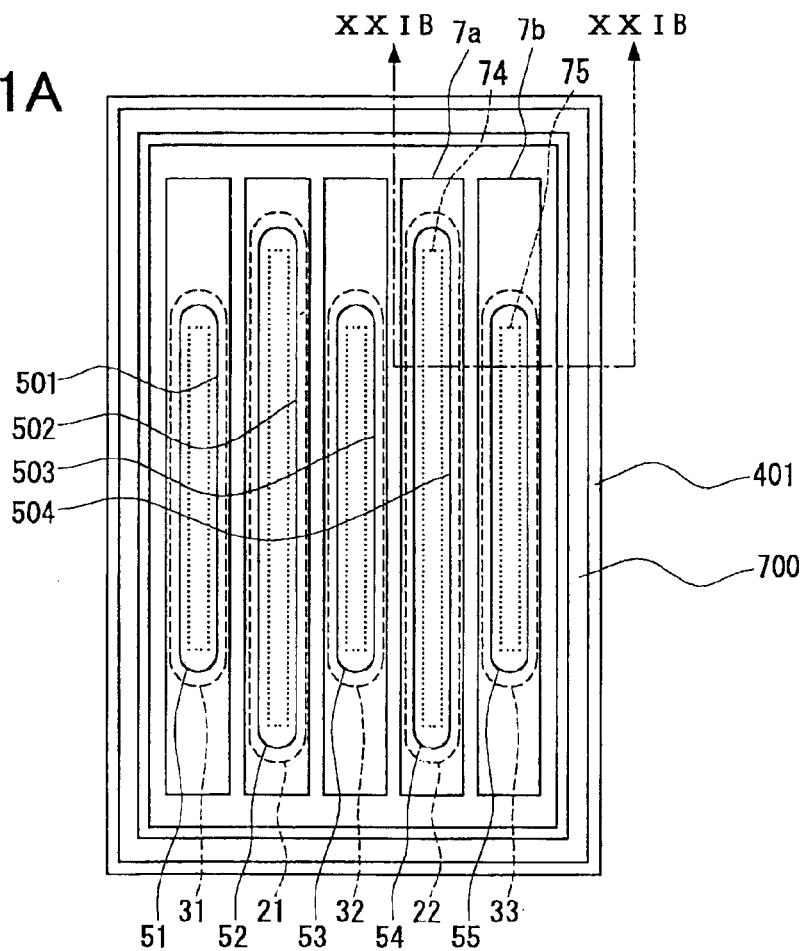
FIG. 21A is a plan view of a PN junction diode according to a nineteenth embodiment.
Figure 21B:
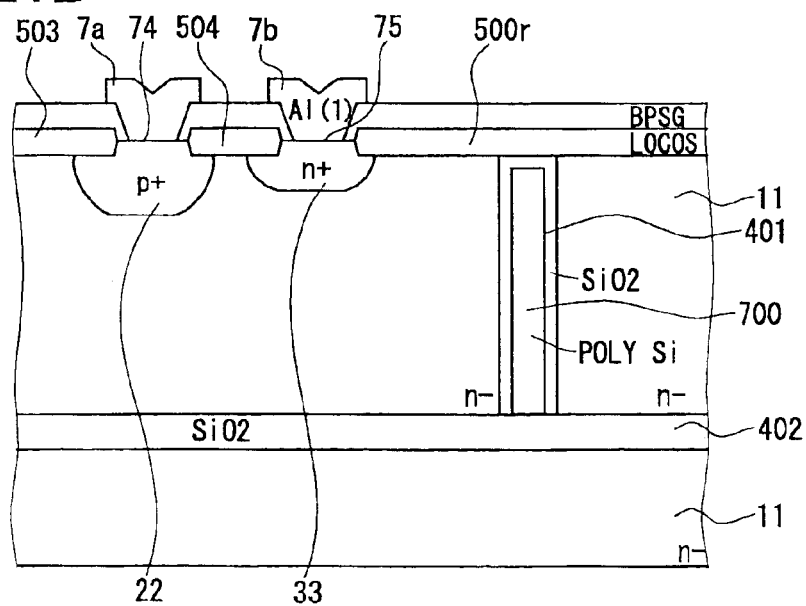
FIG. 21B is an enlarged cross-sectional view of the PN junction diode taken along line XXIB—XXIB in FIG. 21A.

FIG. 21A is a plan view of the PN junction diode according to the present embodiment. FIG. 21B is an enlarged cross-sectional view of the PN junction diode taken along line XXIB—XXIB in FIG. 21A. The same parts in the eighteenth embodiment are designated with the same reference numbers in FIGS. 21A and 21B, and the detailed description will be omitted. In addition, in FIGS. 21A and 21B, the upper layer insulation film 18 comprising TEOS and the upper layer electrodes 9a and 9b comprising Al, and the protection film 20 comprising SiN are omitted.

The PN junction diode according to the present embodiment includes two P-type high impurity concentration diffusion regions 21 and 22 and three N-type high impurity concentration diffusion regions 31, 32, and 33 are alternately arranged. Moreover, these five diffusion rejoins 21, 22, 31, 32, and 33 are surrounded by insulation regions 401 and 402 under the circumference portion 500r of the LOCOS film.

The PN junction diode in FIGS. 21A and 21B is produced as follows:

First, two N-type low impurity concentration silicon (semiconductor) substrates 11 are prepared. A surface of one substrate is oxidized to form a silicon oxide film 402. Next, by a generally known method, these two substrates are adhered to each other to provide a laminated substrate. After that, the oxidized substrate is polished to provide an N-type low impurity concentration silicon layer having a thickness of 10 ìm. Subsequently, the N-type low impurity concentration silicon layer is dry-etched substantially perpendicularly with a mask of a resist or an oxide film until the dry-etching reaches the buried silicon oxide film 402 to form trenches. Next, the sidewalls of the trenches are subjected to thermal oxidation to form silicon oxide ($SiO_2$) films 401, and then polysilicon (Si) 700 is deposited to fill the trenches. After that, the polysilicon remained on the surface is etched and the surface is flattened with chemical machinery polishing. This completes the insulation regions 401 and 402 surrounding the diode forming area. Subsequently, the PN junction diode is formed by the producing method in the first embodiment shown in FIGS. 10A to 10G. In FIG. 21A, the silicon oxide ($SiO_2$) film 401 and the polysilicon (Si) 700 are denoted with solid lines.

According to the present embodiment, in a case where a magnitude of surge current is large, and thereby a surge current leaks from the PN junction region, because the insulation regions 410 and 402 surround the PN junction diode, the leaking surge current can be totally blocked with the insulation regions 401 and 402. This prevents erroneous operations in the semiconductor circuitry around the PN junction diode due to the noise caused by the leaking surge current. This embodiment is applicable to the former embodiments.

It is to be noted that, in the embodiments described above, when the PN junction diode has the lower layer electrodes and the upper layer electrodes, the surge current flows in the lower layer electrodes having narrow widths connected to individual diffusion regions, perpendicularly from the upper electrodes. Thus, resistance of the current path including the lower layer electrodes can be reduced, so that the electrodes can resist a large surge current, preventing the electrodes from being burnt by heat caused by the surge current.

Especially, it is preferable that the widths of the upper layer electrodes are greater than those of the lower layer electrodes. As a result, resistance of current path including the upper layer electrodes can be also reduced.

[Modifications]

In the above-mentioned embodiments, the LOCOS films are used as the high melting point insulation protection film. However, usage of a silicon oxide (SiO) film or a silicon nitride (SiN) film is also possible. Moreover, these films may be laminated. These high melting point insulation protection films have melting points higher than the melting point (1420° C.) of the silicon (Si) substrate (pn junction regions 4a and 4b), so that though the PN junction generates a heat, the high melting point insulation protection film does not melt before the silicon substrate begins to melt. Therefore, even though a relatively large surge current flows in the diffusion regions, insulation capability of the high melting point insulation protection film does not deteriorate, unlike a BPSG film.

These high melting point insulation protection films may be formed by a physical vapor deposition or chemical vapor deposition. Or, these high melting point insulation protection films may be formed by oxidizing or nitriding treatment of the substrate, like a LOCOS film.

Moreover, in the above-mentioned embodiments, the N-type low impurity concentration silicon substrate is used. However, a P-type low impurity concentration silicon substrate is also possible. Moreover, a substrate having an epitaxial film containing N-type or P-type impurity at a low concentration with a thickness of more than 10 ìm is also possible.

As disclosed above, the PN junction diode according to the present invention provides a high withstanding capability as to the surge voltage, so that the integrated circuit including this PN junction diode provides sufficient surge protection.

What is claimed is:

1. A diode comprising:
   a substrate of a first conductivity type;
   first and second stripe diffusion regions which are said first conductivity type and a second conductivity type, respectively, alternately arranged at a regular interval in a surface layer of said semiconductor substrate, longitudinal sides of said first and second stripe diffusion regions being arranged so as to face each other;
   first and second stripe electrodes above said first and second diffusion regions along said longitudinal sides, connected to said first and second diffusion regions, respectively; and
   surge current concentration suppressing means for suppressing concentration of surge current at neighboring ends of said first and second stripe diffusion regions.

2. The diode as claimed in claim 1, wherein said surge current concentration suppressing means comprises:
   chamfered portions formed at the neighboring ends of said first and second stripe diffusion regions by chamfering end edges of said first and second stripe diffusion regions.

3. The diode as claimed in claim 2, wherein said chamfered portion is a semicircle portion.

4. The diode as claimed in claim 1, wherein said surge current concentration suppressing means comprises:
   said second stripe diffusion region of the second conductivity type different from the first conductivity type of said semiconductor substrate, having a longitudinal length greater than said first stripe diffusion region so that end portions of said second stripe diffusion region extend beyond those of said first stripe diffusion region in a longitudinal direction.

5. The diode as claimed in claim 1, wherein said surge current concentration suppressing means comprises:
   a region formed at the end of said second stripe diffusion region of the second conductivity type different from the first conductivity type of said semiconductor substrate, said region having a diffusion concentration which is lower than said second stripe diffusion region.

6. The diode as claimed in claim 1, wherein said surge current concentration suppressing means comprises:

first and second contacts for providing first electrical connection between an intermediate portion of said first stripe diffusion region and said first stripe electrode and second electrical connection between an intermediate portion of said second stripe diffusion region and said second stripe electrode, respectively.

* * * * *

UNITED STATES PATENT AND TRADEMARK OFFICE
CERTIFICATE OF CORRECTION

PATENT NO. : 6,943,383 B2  
DATED : September 13, 2005  
INVENTOR(S) : Ryuichiro Abe and Kenji Kouno It is certified that error appears in the above-identified patent and that said Letters Patent is hereby corrected as shown below:

<u>Title page,</u>
Item [75], insert:
-- [75] Inventors: Ryuichiro Abe, Ichinomiya (JP);
 Kenji Kouno, Gifu (JP) --.

Signed and Sealed this

Thirteenth Day of June, 2006

JON W. DUDAS
*Director of the United States Patent and Trademark Office*